US009966268B2

(12) United States Patent
Ogawa et al.

(10) Patent No.: US 9,966,268 B2
(45) Date of Patent: May 8, 2018

(54) METHOD OF MANUFACTURING SEMICONDUCTOR DEVICE AND SUBSTRATE PROCESSING APPARATUS

(71) Applicant: HITACHI KOKUSAI ELECTRIC INC., Tokyo (JP)

(72) Inventors: Arito Ogawa, Toyama (JP); Atsuro Seino, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days. days.

(21) Appl. No.: 14/501,606

(22) Filed: Sep. 30, 2014

(65) Prior Publication Data
US 2015/0111378 A1  Apr. 23, 2015

(30) Foreign Application Priority Data

Oct. 23, 2013  (JP) .................................. 2013-220378
Sep. 19, 2014  (JP) .................................. 2014-191264

(51) Int. Cl.
| H01L 21/285 | (2006.01) |
| H01L 21/3205 | (2006.01) |
| C23C 16/14 | (2006.01) |
| C23C 16/455 | (2006.01) |
| C23C 16/56 | (2006.01) |
| H01L 21/768 | (2006.01) |

(52) U.S. Cl.
CPC ........ *H01L 21/28568* (2013.01); *C23C 16/14* (2013.01); *C23C 16/45525* (2013.01); *C23C 16/56* (2013.01); *H01L 21/28556* (2013.01); *H01L 21/32051* (2013.01); *H01L 21/76876* (2013.01); *H01L 21/76877* (2013.01)

(58) Field of Classification Search
None
See application file for complete search history.

(56) References Cited

U.S. PATENT DOCUMENTS

| 2003/0153181 | A1* | 8/2003 | Yoon ................... C23C 16/0281 438/685 |
| 2005/0031786 | A1* | 2/2005 | Lee ................... H01L 21/28556 427/255.28 |
| 2006/0009034 | A1* | 1/2006 | Lai ...................... C23C 16/0281 438/680 |
| 2009/0149022 | A1* | 6/2009 | Chan ....................... C23C 16/02 438/660 |
| 2013/0137262 | A1* | 5/2013 | Satoh .................. H01L 21/4814 438/685 |

* cited by examiner

Primary Examiner — Joseph A Miller, Jr.
(74) Attorney, Agent, or Firm — Volpe and Koenig, P.C.

(57) ABSTRACT

Provided are a method of manufacturing a semiconductor device capable of forming a high-quality film having low roughness and resistivity and a substrate processing apparatus and program. The method includes (a) forming an amorphous metal film on a substrate while maintaining the substrate by performing steps (a-1) and (a-2) in a time-divisional manner wherein the step (a-1) includes supplying in the time-divisional manner a metal-containing gas and a first reducing gas to the substrate a predetermined number of times to form a first amorphous metal film on the substrate, and the step (a-2) includes simultaneously supplying the metal-containing gas and a second reducing gas to the substrate having the first amorphous metal film formed thereon to form a second amorphous metal film on the first amorphous metal film; and (b) heating the substrate having the amorphous metal film formed thereon to.

11 Claims, 13 Drawing Sheets

As-deposition

After PDA (600°C)

METHOD OF MANUFACTURING SEMICONDUCTOR DEVICE AND SUBSTRATE PROCESSING APPARATUS

CROSS-REFERENCE TO RELATED PATENT APPLICATION

This U.S. non-provisional patent application claims priority under 35 U.S.C. § 119 of Japanese Patent Application No. 2013-220378, filed on Oct. 23, 2013 and Japanese Patent Application No. 2014-191264, filed on Sep. 19, 2014, in the Japanese Patent Office, the entire contents of which are hereby incorporated by reference.

BACKGROUND OF THE INVENTION

1. Field of the Invention

The present invention relates to a method of manufacturing a semiconductor device, which is capable of forming a thin film on a substrate and a substrate processing apparatus.

2. Description of the Related Art

In recent times, as circuits have been developed to increase the integration degree and performance thereof, a metal film has been required to be formed in a very fine groove with a narrower opening than in the related art. The metal film may be, for example, an electrode to be used in a memory such as a flash memory or a dynamic random access memory (DRAM), a wire between electrodes, or the like.

SUMMARY OF THE INVENTION

When a crystalline film is used to reclaim an opening of a metal film, crystal grains may be coarse or a surface of the metal film may be rough to increase surface roughness, thereby causing a hole to be formed in the metal film. Also, when the hole condenses, a void may occur to cause a gap to be formed in a groove. When the gap is formed, an electrical resistance value of the film may increase. Thus, when the metal film is used to form an electrode or wire, a void is preferably suppressed from being generated. However, when an amorphous film is used to decrease surface roughness (which may be also referred to as simply 'roughness'), a process temperature should be increased when the amorphous film is processed and the resistivity of an obtained metal film may increase.

In order to solve these problems, it is a main object of the present invention to provide a method of manufacturing a semiconductor device, which is capable of forming a film having low roughness and resistivity by suppressing a void from being generated during the forming of the film and a substrate processing apparatus.

According to one aspect of the present invention, there is provided a method of manufacturing a semiconductor device, the method including:

(a) forming an amorphous metal film on a substrate while maintaining the substrate at a first temperature by performing steps (a-1) and (a-2) in a time-divisional manner, wherein the step (a-1) includes supplying in the time-divisional manner a metal-containing gas and a first reducing gas to the substrate a predetermined number of times to form a first amorphous metal film on the substrate, and the step (a-2) includes simultaneously supplying the metal-containing gas and a second reducing gas to the substrate having the first amorphous metal film formed thereon to form a second amorphous metal film on the first amorphous metal film; and (b) heating the substrate having the amorphous metal film formed thereon to a second temperature higher than the first temperature.

BRIEF DESCRIPTION OF THE DRAWINGS

FIGS. 5A to 5F are diagrams illustrating a film forming sequence according to an embodiment of the present invention, in which FIG. 5A illustrates a state of a loaded wafer, FIG. 5B illustrates a state in which a first film forming process according to an embodiment of the present invention is performed on the wafer that is in the state of FIG. 5A, FIG. 5C illustrates a state in which a second film forming process according to an embodiment of the present invention is performed on the wafer that is in the state of FIG. 5B, FIG. 5D illustrates a state in which the first film forming process is performed on the wafer that is in the state of FIG. 5C, FIG. 5E illustrates a state in which the second film forming process is performed on the wafer that is in the state of FIG. 5D, and FIG. 5F illustrates a tungsten (W) film formed by repeatedly performing the first film forming process and the second film forming process.

FIGS. 6A and 6B are graphs illustrating the quality of a film formed according to an embodiment of the present invention, in which FIG. 6A illustrates a result of evaluating an amorphous layer and FIG. 6B illustrates a result of evaluating the amorphous layer of FIG. 6A heated to 600° C.

DETAILED DESCRIPTION OF THE PREFERRED EMBODIMENTS

Figure 1:
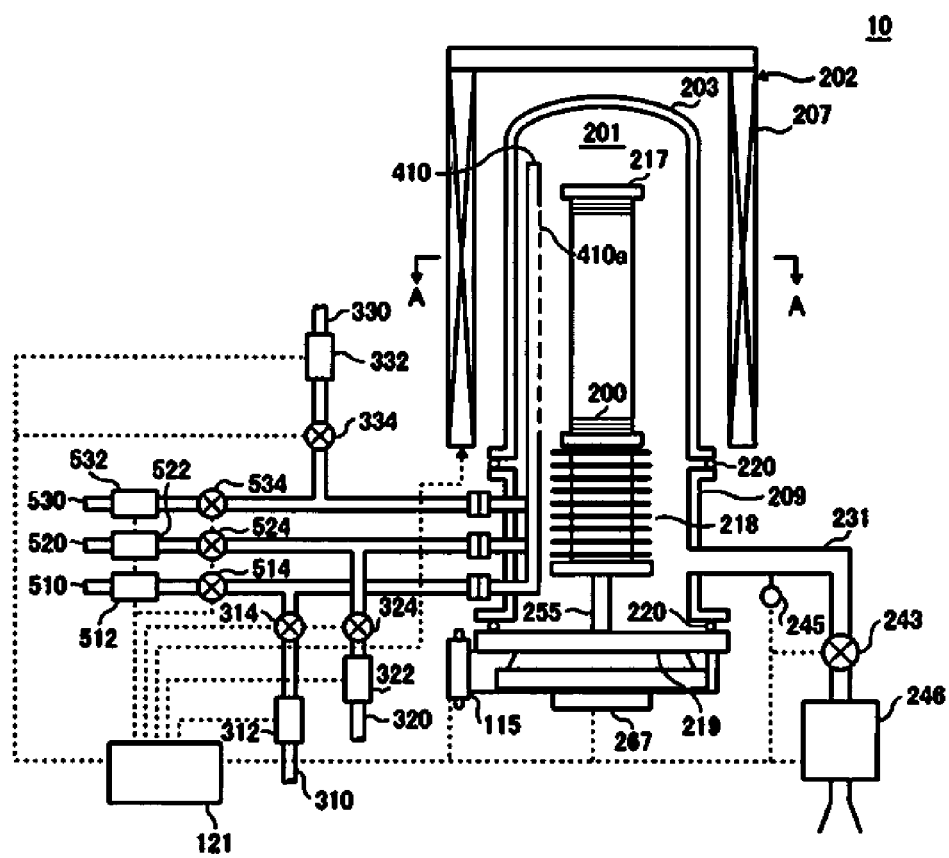
FIG. 1 is a schematic configuration diagram of a process furnace of a substrate processing apparatus according to an embodiment of the present invention, in which a longitudinal sectional view of a process furnace portion is illustrated

As an example, a tungsten (W) film may be used as a metal film for either an electrode to be used in a memory, such as a flash memory, a dynamic random access memory (DRAM), etc., or wire formed between electrodes. The tungsten (W) film may be formed using a method of forming a film on a substrate by simultaneously (or continuously) supplying a plurality of process gases to the substrate to use a reaction of the plurality of process gases in a gas-phase state or at a surface of the substrate, or a method of forming a film on a substrate by supplying a plurality of process gases in a time-division manner (asynchronously, intermittently, temporally separated pulses, or in a pulse-wise manner). When a fine groove with a narrow opening, e.g., a plug, is filled with a metal film, it is efficient to use the latter method of forming a film on a substrate by supplying a plurality of process gases in a time-division manner so as to achieve a more uniform film thickness. However, since the resistivity of the formed metal film is high in this case, the former method of forming a film on a substrate by simultaneously supplying a plurality of process gases is generally used to form the tungsten (W) film.

If roughness is high when a very fine groove is filled with a metal film, the groove is not preferably filled with the metal film and thus a hole may be generated and a void may occur when the hole condenses. Thus, the metal film is preferably in an amorphous state when the groove is filled with the metal film. However, since crystallization temperature of the tungsten (W) film is low, the tungsten (W) film is crystallized at about 200° C. when the method of forming a film on a substrate by simultaneously supplying a plurality of process gases to the substrate is used.

The inventors of the present invention have conducted research and found that an amorphous tungsten (W) layer (A) can be formed to a predetermined film thickness (a) or less even when a plurality of process gases are simultaneously supplied to the substrate at about 200° C. Also, they have found that an amorphous tungsten (W) layer (B) having low roughness can be formed at a low temperature, e.g., 200° C. or less, by supplying a tungsten-containing gas and a reducing gas containing impurities to a substrate in a time-division manner. Also, they have found that an amorphous tungsten (W) film can be formed to a thickness that is greater than the predetermined film thickness (a) by forming the amorphous tungsten (W) layer (B) on the amorphous tungsten (W) layer (A) or repeatedly forming the amorphous tungsten (W) layer (A). That is, they have found that an amorphous tungsten (W) film can be formed to a desired thickness by forming the amorphous tungsten (W) layer (B), which has a film thickness that is less than a minimum film thickness at which the amorphous tungsten (W) layer (A) is crystallized, between the amorphous tungsten (W) layers (A) [i.e., by laminating (stacking) the amorphous tungsten (W) layer (A) and the amorphous tungsten (W) layer (B]. Also, they have found that the amorphous tungsten (W) film can be crystallized by annealing (heating) it to form a crystalline tungsten (W) film on the substrate. When the amorphous tungsten (W) film is annealed, the substrate is preferably heated to about 600° C.

Accordingly, a crystalline tungsten (W) film having low roughness and resistivity may be formed in a very fine groove by forming an amorphous tungsten (W) film to a desired thickness using a combination of the amorphous tungsten (W) layer (A) and the amorphous tungsten (W) layer (B), and annealing the amorphous tungsten (W) film.

Also, for example, when a tungsten (W) layer is formed on a silicon substrate [including a substrate on which a silicon oxide film ($SiO_2$ film) is formed] on which a titanium nitride film (TiN film) is formed on only a top surface other than a back surface or a side surface thereof and may be exposed on a surface thereof, the tungsten (W) layer is likely to delaminate from a portion of the silicon substrate on which the TiN film is not formed. As described above, the inventors of the present invention have found that the tungsten (W) layer may be suppressed from delaminating from even a back surface or a side surface of a substrate on which a TiN film or the like is not formed when an amorphous (W) film is formed to a desired thickness using a combination of the amorphous tungsten (W) layer (A) and the amorphous tungsten (W) layer (B), as will be described in detail below. Tensile stress is applied to the amorphous tungsten (W) layer (A) formed by simultaneously supplying a plurality of process gases to the substrate but compressive stress is applied to the amorphous tungsten (W) layer (B) formed by supplying a tungsten (W)-containing gas and a reducing gas to the substrate in the time-division manner. A film may be suppressed from delaminating since the amorphous tungsten (W) layer (A) to which compressive stress is applied is first formed, the amorphous tungsten (W) layer (B) on which tensile stress is applied is formed, and the amorphous tungsten (W) layers (A) and (B) are alternately and repeatedly formed, as will be described in detail below.

A first embodiment of the present invention will now be described with reference to FIGS. 1 and 2. A substrate processing apparatus 10 is embodied as an example of a device to be used in a substrate processing process which is a process included in a process of manufacturing a semiconductor device (device).

(1) Structure of Process Furnace

A heater 207 serving as heating means (heating mechanism or heating system) is installed at a process furnace 202. The heater 207 is formed in a cylindrical shape, the top end of which is closed.

At an inner side of the heater 207, a reaction tube 203 is concentrically installed concentrically with the heater 207 to form a reaction container (process container). The reaction tube 203 is formed of a heat-resistant material, e.g., quartz ($SiO_2$) or silicon carbide (SiC), and has a cylindrical shape, the top end of which is closed and the bottom end of which is open.

A manifold 209 formed of a metal material such as stainless steel is installed at a lower end of the reaction tube 203. The manifold 209 has a cylindrical shape, and a lower end opening thereof is air-tightly closed with a seal cap 219 which is a lid formed of a metal material such as stainless steel. An O-ring 220 is installed as a seal member between the reaction tube 203 and the manifold 209 and between the manifold 209 and the seal cap 219. A process container is mainly configured by the reaction tube 203, the manifold 209 and the seal cap 219, and a process chamber 201 is formed in the process container. The process chamber 201 is configured to accommodate wafers 200 serving as substrates in a state in which the wafers 200 are arranged vertically in a horizontal posture and a multi-stage manner by a boat 217 which will be described below.

A rotation mechanism 267 that rotates the boat 217 is installed at a side of the seal cap 219 opposite to the process chamber 201. A rotary shaft 255 of the rotation mechanism 267 is connected to the boat 217 while passing through the seal cap 219. The rotation mechanism 267 is configured to rotate the wafers 200 by rotating the boat 217. The seal cap 219 is configured to be vertically moved by a boat elevator 115 which is a lifting mechanism vertically installed outside the reaction tube 203. The boat elevator 115 is configured to load/unload the boat 217 into/from the process chamber 201 by moving the seal cap 219 upward/downward. That is, the boat elevator 115 is configured as a transfer device (transfer mechanism) which transfers the boat 217, i.e., the wafers 200, into or out of the process chamber 201.

The boat 217 which is a substrate retaining mechanism is configured to support a plurality of wafers 200 (e.g., 25 to 200 wafers 200) to be arranged in a horizontal posture and a concentric fashion, in a multistage manner, i.e., to be arranged to be spaced apart from each other. The boat 217 is formed of a heat-resistant material (e.g., quartz or SiC), etc. Below the boat 217, insulating boards 218 formed of a heat-resistant material (e.g., quartz or SiC) are supported in a horizontal posture and a multistage manner. Due to the above structure, heat generated by the heater 207 is suppressed from being transferred to the seal cap 219. However, the present invention is not limited to the above embodiment. For example, an insulating container which is a cylindrical member formed of a heat-resistant material (e.g., quartz or SiC) may be installed below the boat 217 instead of the insulating boards 218. The heater 207 may heat the wafers 200 accommodated in the process chamber 201 to a predetermined temperature.

In the process chamber 201, nozzles 410, 420 and 430 are installed to pass through sidewalls of the manifold 209. Gas supply pipes 310, 320 and 330 are connected as gas supply lines to the nozzles 410, 420 and 430, respectively. As described above, three nozzles 410, 420 and 430 and three gas supply pipes 310, 320 and 330 are installed in the process furnace 202 to supply a plurality of types of gases (here, three types of gases, e.g., process gases, sources, etc.) into the process chamber 201 via exclusive lines thereof.

At the gas supply pipes 310, 320 and 330, mass flow controllers (MFCs) 312, 322 and 332 (MFC) which are flow rate controllers (flow rate control units) and valves 314, 324 and 334 which are opening/closing valves are sequentially installed from an upstream end. The nozzles 410, 420 and 430 are coupled (connected) to front end portions of the gas supply pipes 310, 320 and 330, respectively. The nozzles 410, 420 and 430 are configured as L-shaped long nozzles, the horizontal portions of which are installed to pass through the manifold 209. The nozzles 410, 420 and 430 are installed such that vertical portions thereof are moved upward (in a direction in which the wafers 200 are stacked), i.e., in a direction from an end of a wafer arrangement area to another end of the wafer arrangement area, along an inner wall of the reaction tube 203 in an annular space between inner walls of the reaction tube 203 and the wafers 200. That is, the nozzles 410, 420 and 430 are installed along the wafer arrangement region in which the wafers 200 are arranged in a region that horizontally surrounds the wafer arrangement region at a side of the wafer arrangement region.

Gas supply holes 410a, 420a and 430a are respectively installed at a side of the nozzles 410, 420 and 430 to supply (emit) a gas. The gas supply holes 410a, 420a and 430a are open toward the center of the reaction tube 203. The gas supply holes 410a, 420a and 430a are installed from the bottom of the reaction tube 203 to the top of the reaction tube 203 to have the same opening area and the same pitch.

As described above, in a gas supply method according to the present embodiment, a gas is transferred via the nozzles 410, 420 and 430 arranged in an annular and vertically long space defined by the inner walls of the reaction tube 203 and ends portions of a plurality of stacked wafers 200 (i.e., a cylindrical space) and is then first emitted into the reaction tube 203 from near the wafers 200 via the gas supply holes 410a, 420a and 430a that are open in the nozzles 410, 420 and 430, thereby causing a gas to mainly flow into the reaction tube 203 in a direction that is parallel to surfaces of the wafers 200, i.e., a horizontal direction. Due to the above configuration, a gas may be evenly supplied to the wafers 200 to form a thin film on the wafers 200 to a uniform thickness. Although the gas flowing along the surfaces of the wafers 200, i.e., a gas remaining after a reaction (residual gas), flows in a direction of an exhaust hole, i.e., an exhaust pipe 231 which will be described below, a direction in which the residual gas flows is appropriately defined by the location of the exhaust port and is not limited to a vertical direction.

Carrier gas supply pipes 510, 520 and 530 are respectively connected to the gas supply pipes 310, 320 and 330 to supply a carrier gas. MFC 512, 522 and 532 and valves 514, 524 and 534 are respectively installed at the carrier gas supply pipes 510, 520 and 530.

As an example of the above configuration, a source gas containing a metal element (a metal-containing source, a metal-containing gas, a metal compound, etc.) is supplied as a process gas to the process chamber 201 from the gas supply pipe 310 via the MFC 312, the valve 314 and the nozzle 410. The source gas is, for example, a tungsten (W)-containing element containing tungsten (W) as a metal element, and tungsten hexafluoride ($WF_6$) which is a halide (halogen-based source) may be used as the source gas. The $WF_6$ gas acts as a tungsten (W) source in a substrate processing process which will be described below.

A first reducing gas serving as a process gas for reducing the source gas is supplied into the process chamber 201 from the gas supply pipe 320 via the MFC 322, valve 324 and the nozzle 420. A boron (B)-containing gas (borane-based gas) that contains boron (B), e.g., diborane ($B_2H_6$), is used as the first reducing gas. The $B_2H_6$ gas acts as a boron (B) source in a substrate processing process which will be described below.

A second reducing gas serving as a process gas for reducing the source gas is supplied into the process chamber 201 from the gas supply pipe 330 via the MFC 332, the valve 334 and the nozzle 430. A hydrogen-containing gas that contains hydrogen (H) and does not contain other elements, e.g., hydrogen ($H_2$), is used as the second reducing gas. The $H_2$ gas acts as a hydrogen (H) source in a substrate processing process which will be described below.

An inert gas, e.g., nitrogen ($N_2$) gas, is supplied into the process chamber 201 from the carrier gas supply pipes 510, 520 and 530 via the MFCs 512, 522 and 532, the valves 514, 524 and 534, and the nozzles 410, 420 and 430, respectively.

In the present disclosure, the terms 'process gas', 'source gas' and 'reducing gas' may be understood as sources or reducing agents that are in a gaseous state, e.g., gases obtained by vaporizing or sublimating a source or a reducing agent that is in a liquid or solid state under normal temperature and pressure or a source or a reducing agent that is in a gaseous state under normal temperature and pressure. When the term 'source' is used in the present disclosure, it may be understood as a liquid source that is in a liquid state, a solid source that is in a solid state, a source gas that is in a gaseous state, or a combination thereof. When the term 'reducing agent' is used in the present disclosure, it may be understood as a liquid reducing agent that is in a liquid state, a solid reducing agent that is in a solid state, a reducing gas that is in a gaseous state, or a combination thereof. When a liquid source that is in a liquid state under normal temperature and pressure or a solid source that is in a solid state under normal temperature and pressure is used, the liquid source or the solid source is vaporized or sublimated using a system such as a vaporizer, a bubbler, or a sublimation device and is then supplied as a source gas or a reducing gas.

When a process gas as described above is supplied via the gas supply pipes 310, 320 and 330, a process gas supply system mainly includes the gas supply pipes 310, 320 and 330, the MFCs 312, 322 and 332, and the valves 314, 324 and 334. The nozzles 410, 420 and 430 may be further included in the process gas supply system. The process gas supply system may be referred to simply as a gas supply system.

When a source gas as described above is supplied via the gas supply pipe 310, a source gas supply system mainly includes the gas supply pipe 310, the MFC 312 and the valve 314. The nozzle 410 may be further included in the source gas supply system. The source gas supply system may be also referred to as a source supply system.

When a tungsten (W)-containing gas is supplied as a source gas from the gas supply pipe 310, a tungsten (W)-containing gas supply system mainly includes the gas supply pipe 310, the MFC 312 and the valve 314. The nozzle 410 may be included in the tungsten (W)-containing gas supply system. The tungsten (W)-containing gas supply system may be also referred to as a tungsten (W)-containing source supply system or simply as a tungsten (W) source supply system. When $WF_6$ gas is supplied via the gas supply pipe 310, a titanium (Ti)-containing gas supply system may be also referred to as a $WF_6$ gas supply system. The $WF_6$ gas supply system may be also referred to as a $WF_6$ supply system.

When a reducing gas as described above is supplied via the gas supply pipe 320, 330, a reducing gas supply system mainly includes the gas supply pipes 320 and 330, the MFCs 322 and 332, and the valves 324 and 334. The nozzles 420 and 430 may be further included in the reducing gas supply system. The reducing gas supply system may be also referred to as a reducing agent supply system.

When a boron (B)-containing gas is supplied as a reducing gas via the gas supply pipe 320, a boron (B)-containing gas supply system mainly includes the gas supply pipe 320, the MFC 322 and the valve 324. The nozzle 420 may be further included in a boron (B)-containing gas supply system. The B-containing gas supply system may be also referred to as a B-containing reducing gas supply system or a B-containing reducing agent supply system. When $B_2H_6$ gas is supplied via the gas supply pipe 320, the B-containing gas supply system may be also referred to as a $B_2H_6$ gas supply system. The $B_2H_6$ gas supply system may be also referred to as a $B_2H_6$ supply system.

When a hydrogen (H)-containing gas is supplied as a reducing gas via the gas supply pipe 330, a hydrogen (H)-containing gas supply system mainly includes the gas supply pipe 330, the MFC 332 and the valve 334. The nozzle 430 may be further included in a hydrogen (H)-containing gas supply system. When $H_2$ gas is supplied via the gas supply pipe 330, the H-containing gas supply system may be also referred to as a $H_2$ gas supply system. The $H_2$ gas supply system may be also referred to as a $H_2$ supply system.

A carrier gas supply system mainly includes the carrier gas supply pipes 510 and 520 and 530, the MFCs 512, 522 and 532, and the valves 514, 524 and 534. When an inert gas is supplied as a carrier gas, the carrier gas supply system may be also referred to as an inert gas supply system. Since the inert gas may also act as a purge gas, the inert gas supply system may be also referred to as a purge gas supply system.

At the manifold 209, the exhaust pipe 231 is installed to exhaust an atmosphere in the process chamber 201. As illustrated in FIG. 2, the exhaust pipe 231 is installed to pass through the sidewalls of the manifold 209, similar to the nozzles 410, 420 and 430. The exhaust pipe 231 is installed at a location on a plane opposite to the nozzles 410, 420 and 430 with the wafers 200 therebetween. Due to the above configuration, a gas supplied near the wafers 200 in the process chamber 201 via the gas supply holes 410a, 420a and 430a flows in a horizontal direction, i.e., a direction parallel to a surface of the wafer 200, flows downward, and is then exhausted via the exhaust pipe 231. A gas flows in the process chamber 201 mainly in the horizontal direction as described above.

A pressure sensor 245 serving as a pressure detector (pressure detection unit) which detects pressure in the process chamber 201, an auto pressure controller (APC) valve 243 serving as a pressure controller (pressure control unit) which controls pressure in the process chamber 201, and a vacuum pump 246 serving as a vacuum exhaust device are sequentially connected to the exhaust pipe 231 from an upstream end of the exhaust pipe 231. The APC valve 243 is configured to perform or suspend vacuum-exhaust in the process chamber 201 by opening/closing the APC valve 243 while the vacuum pump 246 is operated, and to adjust pressure in the process chamber 201 by controlling the degree of opening the APC valve 243 based on pressure information detected by the pressure sensor 245 while the vacuum pump 246 is operated.

The APC valve 243 forms a part of an exhaust channel of an exhaust system, and functions as not only a pressure adjustor but also an exhaust channel opening/closing unit for closing or sealing the exhaust channel of the exhaust system, i.e., an exhaust valve. Also, a trapping device that captures a reaction byproduct or a non-reacted source gas contained in an exhaust gas or a detoxicating device that removes a corrosive component or a toxic component contained in the exhaust gas may be connected to the exhaust pipe 231. An exhaust system, i.e., an exhaust line, mainly includes the exhaust pipe 231, the APC valve 243 and the pressure sensor 245. The vacuum pump 246 may be further included in the exhaust system. Also, the trapping device or the detoxicating device may be further included in the exhaust system.

In the reaction tube 203, a temperature sensor 263 is installed as a temperature detector. The temperature sensor 263 is configured to control an amount of current to be supplied to the heater 207 based on temperature information detected by the temperature sensor 263, so that the temperature in the process chamber 201 may have a desired temperature distribution. The temperature sensor 263 has an L shape similar to the nozzles 410, 420 and 430, and is installed along the inner wall of the reaction tube 203.

Figure 3:
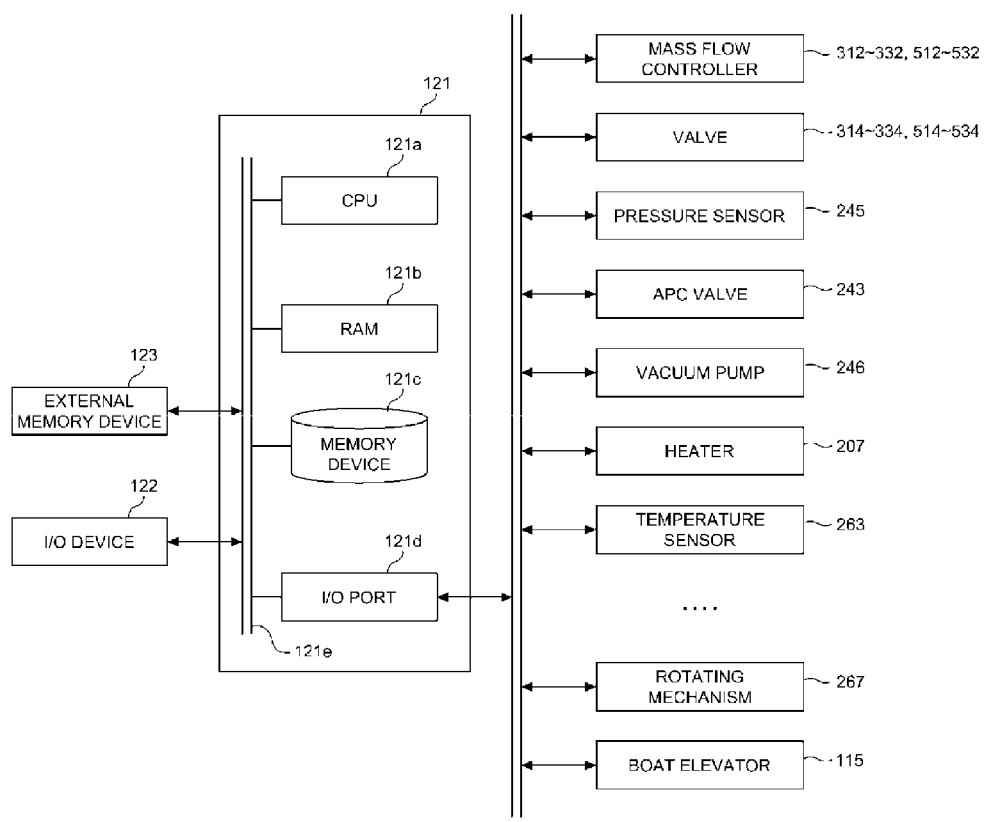
FIG. 3 is a block diagram of a controller included in the substrate processing apparatus of FIG. 1.

As illustrated in FIG. 3, a controller 121 which is a control unit (control means) is configured as a computer including a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a via an internal bus 121e. An I/O device 122 configured as a touch panel or the like is connected to the controller 121.

The memory device 121c is configured as a flash memory, a hard disk drive (HDD), or the like. In the memory device 121c, a control program for controlling an operation of a substrate processing apparatus, a process recipe including the order or conditions of substrate processing which will be described below, or the like is stored to be readable. The process recipe is a combination of sequences of a substrate processing process which will be described below to obtain a desired result when the sequences are performed by the controller 121, and acts as a program. Hereinafter, the process recipe, the control program, etc. will be referred to together simply as a 'program.' When the term 'program' is used in the present disclosure, it may be understood as including only a process recipe, only a control program, or both of the process recipe and the control program. The RAM 121b is configured as a memory area (work area) in which a program or data read by the CPU 121a is temporarily stored.

The I/O port 121d is connected to the MFCs 312, 322, 332, 512, 522 and 532, the valves 314, 324, 334, 514, 524 and 534, the APC valve 243, the pressure sensor 245, the vacuum pump 246, the heater 207, the temperature sensor 263, the rotation mechanism 267, the boat elevator 115, etc.

The CPU 121a is configured to read and execute the control program from the memory device 121c and to read the process recipe from the memory device 121c according to a manipulation command received via the I/O device 122. The CPU 121a is configured based on the read process recipe to control flow rates of various gases via the MFCs 312, 322, 332, 512, 522 and 532; control opening/closing of the valves 314, 324, 334, 514, 524 and 534; control the degree of pressure by opening/closing the APC valve 243 based on the pressure sensor 245 using the APC valve 243; control temperature using the heater 207 based on the temperature sensor 263; control driving/suspending of the vacuum pump 246; control the rotation and rotation speed of the boat 217 using the rotation mechanism 267; control upward/downward movement of the boat 217 using the boat elevator 115, etc.

The controller 121 is not limited to a dedicated computer and may be configured as a general-purpose computer. For example, the controller 121 according to the present embodiment may be configured by preparing an external memory device 123 storing a program as described above, e.g., a magnetic disk (e.g., a magnetic tape, a flexible disk, a hard disk, etc.), an optical disc (e.g., a compact disc (CD), a digital versatile disc (DVD), etc.), a magneto-optical (MO) disc, or a semiconductor memory (e.g., a Universal Serial Bus (USB) memory, a memory card, etc.), and then installing the program in a general-purpose computer using the external memory device 123. However, means for supplying a program to a computer are not limited to using the external memory device 123. For example, a program may be supplied to a computer using communication means, e.g., the Internet or an exclusive line, without using the external memory device 123. The memory device 121c or the external memory device 123 may be configured as a non-transitory computer-readable recording medium. Hereinafter, the memory device 121c and the external memory device 123 may also be referred to together simply as a 'recording medium.' When the term 'recording medium' is used in the present disclosure, it may be understood as only the memory device 121c, only the external memory device 123, or both the memory device 121c and the external memory device 123.

(2) Substrate Processing Process

An example of a process of forming a metal film, which forms, for example, a gate electrode, on a substrate will now be described as a process included in a process of manufacturing a semiconductor device (device) with reference to FIG. 4. The process of forming a metal film is performed using the process furnace 202 of the substrate processing apparatus 10 described above. In the following description, operations of various elements of the substrate processing apparatus 10 are controlled by the controller 121.

In an exemplary sequence according to the present embodiment, a process of forming an amorphous metal film (e.g., a tungsten (W) film) on the wafer 200 by performing a predetermined number of times in a time-division manner (asynchronously, intermittently, temporally separated pulses, or in a pulse-wise manner) a process of forming a first amorphous metal layer (e.g., a tungsten (W) layer) on the wafer 200 by supplying a metal-containing gas (e.g., $WF_6$ gas) and a first reducing gas (e.g., $B_2H_6$ gas) to the wafer 200 in the time-division manner a predetermined number of times and a process of forming a second amorphous metal layer (e.g., a tungsten (W) layer) on the first amorphous metal layer by simultaneously supplying a metal-containing gas and a second reducing gas (e.g., $H_2$ gas) to the wafer 200 on which the first amorphous metal layer is formed; and a process of forming a crystalline metal layer (e.g., a tungsten (W) layer) on the amorphous metal film formed on the wafer 200 by simultaneously supplying a metal-containing gas and a first reducing gas to the wafer 200 on which the amorphous metal film is formed are performed.

Figure 4:
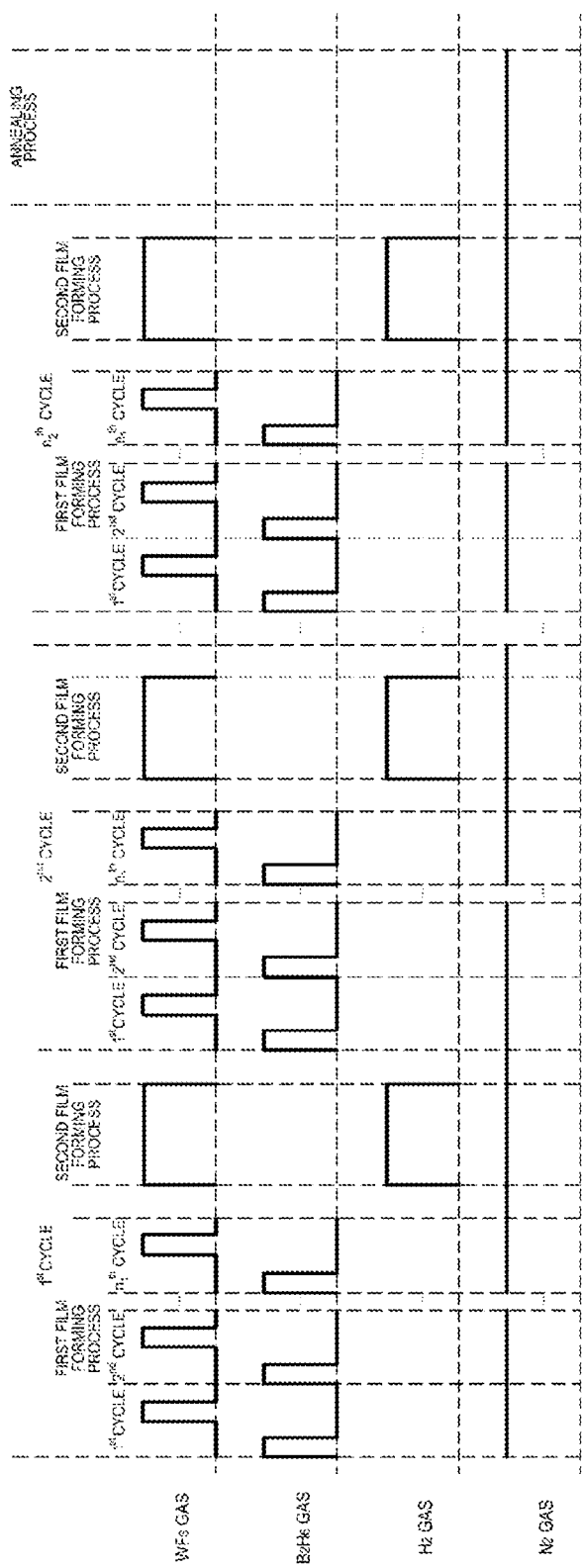
FIG. 4 is a timing chart of a film forming sequence according to an embodiment of the present invention.

In detail, as in a sequence illustrated in FIG. 4, a crystalline tungsten (W) film is formed on the wafer 200 by performing a step of forming an amorphous tungsten (W) film (which may be also referred to as an amorphous tungsten (W) film or an α-tungsten (W) film) on the wafer 200 by performing a predetermined number of times ($n_2$ times) in the time division manner a step of forming a first amorphous tungsten (W) layer (which may be also referred to as an amorphous tungsten (W) layer or an α-tungsten (W) layer) on the wafer 200 by supplying $WF_6$ gas and $B_2H_6$ gas a predetermined number of times ($n_1$ times) in the time-division manner (first film forming process) and a step of forming a second α-tungsten (W) layer on the first α-tungsten (W) layer by simultaneously supplying $WF_6$ gas and $H_2$ gas to the wafer 200 on which the first α-tungsten (W) layer is formed (second film forming process); and a step of heating the amorphous tungsten (W) film (which may be also referred to as an amorphous tungsten (W) film or an α-tungsten (W) film) formed on the wafer 200.

In the present disclosure, the expression 'performs processing (which may be also referred to as a process, a cycle, a step, or the like) a predetermined number of times' means performing the processing once or a plurality of times. That is, it means performing the processing at least once. FIGS. 5A to 5F illustrate cases in which processes (cycle) are repeatedly and alternately performed in $n_1$ cycles or $n_2$ cycles. A value of $n_1$ is appropriately selected. In particular, a value of $n_1$ is appropriately selected according to a thickness of a second α-tungsten (W) layer sufficient to prevent a first α-tungsten (W) layer (which will be formed in a subsequent process) from being crystallized. A value of $n_2$ is appropriately selected according to a film thickness required for an α-tungsten (W) film which is to be finally formed.

Also, in the present disclosure, the terms 'time-division' means time-based separation. For example, in the present disclosure, processes that are performed in the time-division manner may be understood as performing the processes asynchronously, i.e., not to be synchronized with each other. In other words, it may be understood as performing the processes intermittently (or in a pulse-wise manner), in temporally separated pulses, or alternately, i.e., supplying process gases to the process furnace 202 so as not to be mixed with one another. When the processes are performed a plurality of times, process gases supplied during the processes are alternately supplied so as not to be mixed with one another.

When the term 'wafer' is used in the present disclosure, it should be understood as either the wafer itself, or both the wafer and a stacked structure (assembly) including a layer/film formed on the wafer (i.e., the wafer and the layer/film formed thereon may also be referred to collectively as the 'wafer'). Also, when the expression 'surface of the wafer' is used in the present disclosure, it should be understood as either a surface (exposed surface) of the wafer itself or a surface of a layer/film formed on the wafer, i.e., an uppermost surface of the wafer as a stacked structure.

Thus, in the present disclosure, the expression 'specific gas is supplied onto a wafer' should be understood to mean that the specific gas is directly supplied onto a surface (exposed surface) of the wafer or that the specific gas is supplied onto a surface of a layer/film on the wafer, i.e., on the uppermost surface of the wafer as a stacked structure. Also, in the present disclosure, the expression 'a layer (or film) is formed on the wafer' should be understood to mean that the layer (or film) is directly formed on a surface (exposed surface) of the wafer itself or that the layer (or film) is formed on a layer/film on the wafer, i.e., on the uppermost surface of the wafer as a stacked structure.

Also, in the present disclosure, the term 'substrate' has the same meaning as the term 'wafer.' Thus, the term 'wafer' may be used interchangeably with the term 'substrate.'

Also, in the present disclosure, the term 'metal film' means a film formed of a conductive material including metal atoms (which may be also referred to simply as a conductor film). Examples of the metal film include a metal film formed mainly of metal atoms, a conductive metal nitride film, a conductive metal oxide film, a conductive metal oxynitride film, a conductive metal oxycarbide film, a conductive metal composite film, a conductive metal alloy film, a conductive metal silicide film, a conductive metal carbide film, a conductive metal carbonitride film, etc. Also, a tungsten (W) film is a conductive metal film and a metal film.

In the present disclosure, the term 'amorphous film (or layer)' means that a main component of a corresponding film (layer) is not crystallized. The term 'crystalline film (or layer)' means that a main component of a corresponding film (layer) is crystallized (a crystalline structure). Thus, since the 'amorphous film (or layer)' may include a crystalline component that is not a main component, the 'crystalline film (or layer)' may include an amorphous component that is not a main component. Also, when 'α' or 'a' is added to the name of a film, it should be understood to mean that the film is amorphous.

A method of forming a crystalline tungsten (W) film as a metal film on a substrate according to the present embodiment will be described below. The method is divided into two processes of forming an α-tungsten (W) layer on a substrate according to different methods. First, a first α-tungsten (W) layer is formed on the substrate by alternately supplying a plurality of gases (first film forming process). Next, a second α-tungsten (W) layer is formed on the first α-tungsten (W) layer by simultaneously supplying a plurality of gases to form a mixed atmosphere (second film forming process).

[Wafer Charging and Boat Loading]

Figure 2:
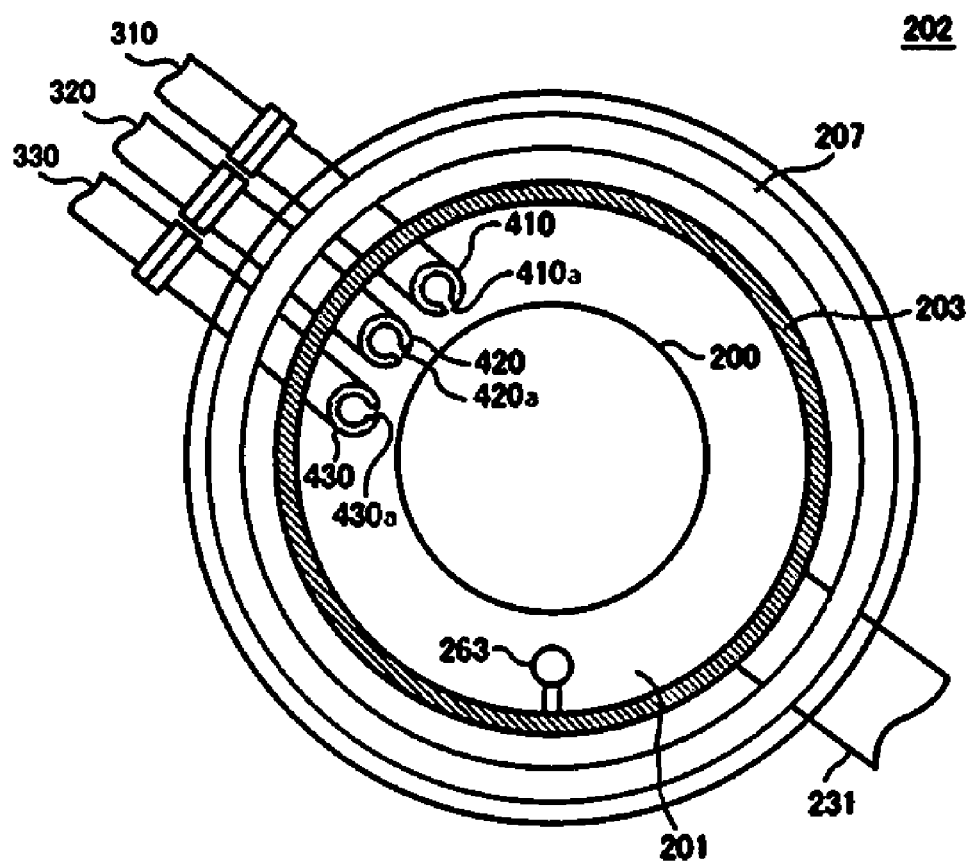
FIG. 2 is a cross-sectional view taken along line A-A of FIG. 1.

When a plurality of wafers 200 are placed in the boat 217 (wafer charging), the boat 217 supporting the plurality of wafers 200 is lifted by the boat elevator 115 and loaded into the process chamber 201 (boat loading), as illustrated in FIG. 1. In this state, the lower end opening of the manifold 209 is blocked by the seal cap 219 via the O-ring 220.

[Pressure & Temperature Control]

The inside of the process chamber 201 is vacuum-exhausted to a desired pressure (degree of vacuum) by the vacuum pump 246. In this case, the pressure in the process chamber 201 is measured by the pressure sensor 245, and the APC valve 243 is feedback-controlled based on information regarding the measured pressure (pressure control). The vacuum pump 246 is continuously operated at least until processing of the wafers 200 is completed. Also, the wafers 200 in the process chamber 201 are heated to a desired temperature by the heater 207. In this case, an amount of current supplied to the heater 207 is feedback-controlled based on temperature information detected by the temperature sensor 263, so that the inside of the process chamber 201 may have a desired temperature distribution (temperature control). The heating of the inside of the process chamber 201 by the heater 207 is continuously performed at least until the processing of the wafers 200 is completed. Then, rotation of the boat 217 and the wafers 200 by the rotation mechanism 267 begins. Also, the rotation of the boat 217 and the wafers 200 by the rotation mechanism 267 is continuously performed at least until the processing of the wafers 200 is completed.

A very fine groove is formed in the loaded wafers 200. In the present embodiment, a tungsten (W) film is formed in the very fine groove. The tungsten (W) film is used as, for example, a floating gate electrode of a flash memory and is thus required to have a low resistance value or a dense structure.

A silicon oxide ($SiO_2$) layer is formed as a charge accumulation layer in the very fine groove beforehand, and a TiN film is formed as a barrier metal layer on the silicon oxide ($SiO_2$) layer. A tantalum nitride (TaN) film may be formed as the barrier metal layer instead of the TiN film. With the barrier metal layer, an adhesion between a tungsten (W) layer and the $SiO_2$ layer according to the present invention may be enhanced.

[Amorphous Tungsten (W) Film Forming Process]

A process (step) of forming an amorphous tungsten (W) film (α-tungsten (W) film) is performed. The process of forming an amorphous tungsten (W) film includes a first film forming process and a second film forming process.

(1) First Film Forming Process

A process (step) of forming a first α-tungsten (W) layer is performed. The first film forming process includes a first reducing gas supply process, a residual gas removing process, a metal-containing gas supply process and a residual gas removing process which will be described below.

[First Reducing Gas Supply Process]

The valve 334 is opened to supply $B_2H_6$ gas into the gas supply pipe 330. The flow rate of the $B_2H_6$ gas flowing inside the gas supply pipe 330 is adjusted by the MFC 332, and the flow rate-adjusted $B_2H_6$ gas is supplied into the process chamber 201 via the gas supply hole 430a of the nozzle 430 and is then exhausted via the exhaust pipe 231. In this case, the $B_2H_6$ gas is supplied onto the wafer 200. That is, a surface of the wafer 200 is exposed to the $B_2H_6$ gas. At the same time, the valve 534 is opened to supply $N_2$ gas to the carrier gas supply pipe 530. The flow rate of the $N_2$ gas flowing inside the carrier gas supply pipe 530 is adjusted by the MFC 532, and the flow rate-adjusted $N_2$ gas is supplied into the process chamber 201 together with the $B_2H_6$ gas and is then exhausted via the exhaust pipe 231. In this case, the valves 514 and 524 are opened to supply $N_2$ gas into the carrier gas supply pipes 510 and 520 so as to prevent the $B_2H_6$ gas from flowing into the nozzles 410 and 420. The $N_2$ gas is supplied into the process chamber 201 via the gas supply pipes 310 and 320 and the nozzles 410 and 420, and is exhausted via the exhaust pipe 231.

In this case, the pressure in the process chamber 201 is adjusted to be equal to a pressure (e.g., 60 Pa) that is within, for example, a range of 50 to 1,000 Pa, by appropriately controlling the APC valve 243. A supply flow rate of the $B_2H_6$ gas controlled by the MFC 332 is set, for example, to be within a range of 1 to 10 sccm. A duration for which the $B_2H_6$ gas is supplied onto the wafers 200, i.e., a gas supply time (irradiation time), is set to range, for example, from 10 to 30 seconds. In this case, the temperature of the heater 207 is set such that the wafer 200 has a temperature (e.g., 200° C.) that is within a range of 100° C. to 250° C., and preferably, a range of 150° C. to 200° C. This is because a film is not formed according to a technique used in the second film forming process when the temperature of the wafer is less than 100° C., and the $B_2H_6$ gas is self-decomposed in an atmosphere of about 250° C. or more, but a film is highly likely to be prevented from being formed when boron (B) decomposed from the $B_2H_6$ gas is adsorbed onto a surface of the wafer 200. Also, a film is less likely to be prevented from being formed when an atmosphere in the process chamber 201 is not heated as in a cold wall furnace and the $B_2H_6$ gas is thus adsorbed in the atmosphere without being self-decomposed. Only the $B_2H_6$ gas and $N_2$ gas are supplied into the process chamber 201, and a surface of the wafer 200 is reduced due to the supply of the $B_2H_6$ gas. Also, after a second cycle (after a $2^{nd}$ cycle), an α-tungsten (W)-containing layer formed on the wafer 200 is reduced to form a second α-tungsten (W) layer in a metal-containing gas supply process which will be described below. That is, hydrogen (H) contained in the $B_2H_6$ gas reacts with fluorine (F) contained in α-tungsten (W)-containing layer formed in the metal-containing gas supply process to form hydrogen fluoride (HF). In this case, at least some of boron (B) atoms which are residual components of the $B_2H_6$ gas remain as residual components in the first α-tungsten (W) layer. Thus, at least a part of the first α-tungsten (W) layer becomes an α-W(B) layer, i.e., an α-tungsten (W) layer containing boron (B). The reason why the $B_2H_6$ gas is supplied before $WF_6$ gas is supplied is because a component of the substrate may be etched by fluorine (F) when the component of the substrate is in contact with the $WF_6$ gas.

[Residual Gas Removing Process]

Then, the inside of the process chamber 201 is vacuum-exhausted by the vacuum pump 246 while the APC valve 243 is open so as to remove the $B_2H_6$ gas, which remains in the process chamber 201 or has contributed to a reduction reaction, from the inside of the process chamber 201. That is, the $B_2H_6$ gas (that does not react or has contributed to the reduction reaction) that remains in a space in which the wafer 200 is present is removed. In this case, $N_2$ gas is continuously supplied into the process chamber 201 while the valves 514, 524 and 534 are open. The $N_2$ gas may act as a purge gas to increase the effect of removing the $B_2H_6$ gas (that does not react or that has contributed to the reduction reaction) remaining in the process chamber 201 from the process chamber 201. In this case, when a byproduct occurs in the process chamber 201 during the first reducing gas supply process, the byproduct is also removed from the inside of the process chamber 201.

In this case, the gas remaining in the process chamber 201 may not be completely removed and the inside of the process chamber 201 may not be completely purged. A small amount of gas may remain in the process chamber 201 when a subsequent process will not be badly influenced by the gas. The flow rate of the $N_2$ gas to be supplied into the process chamber 201 need not be high. For example, the inside of the process chamber 201 may be purged without causing a subsequent process to be badly influenced by the gas by supplying an amount of a gas corresponding to the capacity of the reaction tube 203 (the process chamber 201). When the inside of the process chamber 201 is not completely purged, a purge time may be reduced to improve the throughput. Furthermore, the consumption of the $N_2$ gas may be reduced to a necessary minimum level.

[Metal-Containing Gas Supply Process]

The valve 314 is opened to supply $WF_6$ gas into the gas supply pipe 310. A flow rate of the $WF_6$ gas flowing inside the gas supply pipe 310 is adjusted by the MFC 312, and the flow rate-adjusted $WF_6$ gas is supplied into the process chamber 201 via the gas supply hole 410a of the nozzle 410 and is then exhausted via the exhaust pipe 231. In this case, $WF_6$ gas is supplied onto the wafer 200. That is, a surface of the wafer 200 is exposed to the $WF_6$ gas. At the same time, the valve 514 is opened to supply $N_2$ gas into the carrier gas supply pipe 510. A flow rate of the $N_2$ gas flowing inside the carrier gas supply pipe 510 is adjusted by the MFC 512, and the flow rate-adjusted $N_2$ is supplied into the process chamber 201 together with the $WF_6$ gas and is then exhausted via the exhaust pipe 231. In this case, the valves 524 and 534 are opened to supply $N_2$ gas into the carrier gas supply pipes 520 and 530 so as to prevent the $WF_6$ gas from flowing into the nozzles 420 and 430. The $N_2$ gas is supplied into the process chamber 201 via the gas supply pipes 320 and 330 and the nozzles 420 and 430 and, is then exhausted via the exhaust pipe 231.

In this case, the APC valve 243 is appropriately adjusted to set the pressure in the process chamber 201 to be equal to a pressure (e.g., 30 Pa) that is within, for example, a range of 20 to 50 Pa. A supply rate of the $WF_6$ gas controlled by the MFC 312 is set to be within, for example, a range of 1.0 g/min to 2.0 g/min. A duration for which the $WF_6$ gas is supplied onto the wafers 200, i.e., a gas supply time (irradiation time), is set to be within, for example, a range of 3 to 10 seconds. In this case, the temperature of the heater 207 is set to be substantially the same as that in the first reducing gas supply process. Only the $WF_6$ gas and the $N_2$ gas are supplied into the process chamber 201, and for example, an α-tungsten (W)-containing layer having a thickness of less than one atomic layer is formed on the wafer 200 reduced by the supply of the $WF_6$ gas.

Ideally, the α-tungsten (W)-containing layer is an α-tungsten (W) layer, but an α-W(F) layer may a main component of the α-tungsten (W)-containing layer. Examples of the α-tungsten (W) layer include not only a continuous layer formed of α-tungsten (W) but also a discontinuous layer formed of α-tungsten (W). That is, the α-tungsten (W) layer may be a tungsten (W) deposition layer formed of α-tungsten (W) and having a thickness of less than one atomic layer to several atomic layers. The α-W(F) layer is a tungsten (W)-containing layer that contains fluorine (F) but may be an α-tungsten (W) layer that contains fluorine (F) or an adsorption layer of $WF_6$ gas. When α-W(F) layer is a main component, a reduction reaction according to a reducing gas supply process becomes effective.

A tungsten (W) layer that contains fluorine (F) generally refers to all layers including a continuous layer formed of tungsten (W) and containing fluorine (F), a discontinuous layer formed of tungsten (W) and containing fluorine (F), and a tungsten (W) thin film containing fluorine (F) which is obtained by overlapping the continuous layer and the discontinuous layer. The continuous layer formed of tungsten (W) and containing fluorine (F) may be also referred to as a tungsten (W) thin film containing fluorine (F). Tungsten (W) that constitutes a tungsten (W) layer containing fluorine (F) should be understood as including not only tungsten (W) from which a bond with fluorine (F) is not completely broken but also tungsten (W) from which the bond with fluorine (F) is completely broken.

Examples of the adsorption layer of $BCl_3$ gas include not only a continuous adsorption layer including $WF_6$ molecules but also a discontinuous adsorption layer including $WF_6$ molecules. That is, the adsorption layer of $WF_6$ gas includes an adsorption layer formed of $WF_6$ molecules to a thickness of one molecular layer or less than one molecular layer. $WF_6$ molecules of the adsorption layer of the $WF_6$ gas may have a chemical formula in which a bond between tungsten (W) and fluorine (F) is partially broken. That is, the adsorption layer of $WF_6$ gas may be a physical adsorption layer of $WF_6$ gas, a chemical adsorption layer of $WF_6$ gas, or both.

Here, a layer having a thickness of less than one atomic layer means a discontinuously formed atomic layer, and a layer having a thickness of one atomic layer means a continuously formed atomic layer. A layer having a thickness of less than one molecular layer means a discontinuously formed molecular layer, and a layer having a thickness of one molecular layer means a continuously formed molecular layer. An α-tungsten (W)-containing layer may include not only a tungsten (W) layer containing fluorine (F) but also an adsorption layer of $WF_6$ gas. However, an α-tungsten (W)-containing layer may be denoted by an expression such as 'one atomic layers', 'several atomic layers', etc. as described above.

Tungsten (W) is deposited on the wafer 200 to form a tungsten (W) layer containing fluorine (F) on the wafer 200 under conditions in which $WF_6$ gas is self-decomposed (pyrolyzed), i.e., conditions causing a pyrolysis reaction of the $WF_6$ gas. $WF_6$ is adsorbed onto the wafer 200 to form an adsorption layer of the $WF_6$ gas on the wafer 200 under conditions in which $WF_6$ gas is not self-decomposed (pyrolyzed), i.e., conditions that do not cause a pyrolysis reaction of the $WF_6$ gas. A film-forming rate may be higher when the tungsten (W) layer containing fluorine (F) is formed on the wafer 200 than when the adsorption layer of the $WF_6$ gas is formed on the wafer 200.

If the thickness of a tungsten (W)-containing layers exceeds a thickness of several atomic layers, a reduction action of a first reducing gas supply process to be performed in a subsequent cycle will do not have an effect on an entire α-tungsten (W)-containing layer. A minimum value of the thickness of the α-tungsten (W)-containing layer is less than one atomic layer. Thus, a first layer may be set to have a thickness of less than one atomic layer to several atomic layers. The reaction action performed in the first reducing gas supply process may be relatively increased by controlling the α-tungsten (W)-containing layer to have a thickness of not more than one atomic layer, i.e., a thickness of less than one atomic layer or of one atomic layer, thereby reducing a time required to perform the reduction action in the first reducing gas supply process. Also, a time required to form the α-tungsten (W)-containing layer in the metal-containing gas supply process may be reduced. Accordingly, a process time per cycle may be reduced and a process time to perform a total number of cycles may thus be reduced. That is, a film-forming rate may be increased. Also, the controllability of film thickness uniformity may be increased by controlling the α-tungsten (W)-containing layer to have a thickness of one atomic layer or less.

[Residual Gas Removing Process]

After the α-tungsten (W)-containing layer is formed to a predetermined thickness, the valve 314 is closed to stop the supply of the $WF_6$ gas. In this case, the inside of the process chamber 201 is vacuum-exhausted by the vacuum pump 246 while the APC valve 243 is open, and the $WF_6$ gas (that does not react or that has contributed to the formation of the α-tungsten (W)-containing layer) remaining in the process chamber 201 is removed from the inside of the process chamber 201. That is, the $WF_6$ gas (that does not react or that has contributed to the formation of the α-tungsten (W)-containing layer) remaining in a space, in which the wafer 200 on which the α-tungsten (W)-containing layer is formed is present, is removed. In this case, $N_2$ gas is continuously supplied into the process chamber 201 while the valves 514, 524 and 534 are open. The $N_2$ gas may act as a purge gas to increase the effect of removing the $WF_6$ gas (that does not react or that has contributed to the formation of the α-tungsten (W)-containing layer) remaining in the process chamber 201 from the process chamber 201.

In this case, the gas remaining in the process chamber 201 may not be completely removed and the inside of the process chamber 201 may not be completely purged, similar to the process of removing a residual gas performed after the first reducing gas supply process.

[Performing a Cycle a Predetermined Number of Times]

A first α-tungsten (W) layer is formed on the wafer 200 to a predetermined thickness by performing at least once (i.e., a predetermined number of times) a cycle of sequentially performing the first reducing gas supply process, the residual gas removing process, the metal-containing gas supply process and the residual gas removing process in the time-division manner (asynchronously, intermittently, temporally separated pulses, or a pulse-wise manner), i.e., by performing $n_1$ cycles each including the first reducing gas supply process, the residual gas removing process, the metal-containing gas supply process and the residual gas removing process. Here, '$n_1$' denotes an integer that is equal to or greater than 1. For a first α-tungsten (W) layer as a first layer, the predetermined thickness is determined in consideration of a thickness of a film required as a seed layer. For a first α-tungsten (W) layer formed after a second layer, the predetermined thickness is determined in consideration of a thickness of a film required to form the tungsten (W) layer, which is formed on the first α-tungsten (W) layer, to be an amorphous tungsten (W) layer (second α-tungsten (W) layer) without being crystallized when the second film forming process is performed. For example, after the second layer, the number of cycles may be controlled to adjust a film thickness to about 1 Å to 2 Å. In this case, the first α-tungsten (W) layer may be formed as a continuous layer having a smooth surface and a dense structure. The above process is preferably performed a plurality of times.

(2) Second Film Forming Process

A process (step) of forming a second α-tungsten (W) layer (amorphous tungsten (W) layer) is performed. The second film forming process includes a metal-containing gas and a second reducing gas supply process and a residual gas removing process which will be described below.

[Process of Supplying Metal-Containing Gas and Second Reducing Gas]

The valves 314 and 324 are opened to supply $WF_6$ gas and $H_2$ gas into the gas supply pipes 310 and 320, respectively. Flow rates of the $WF_6$ gas flowing inside the gas supply pipe 310 and the $H_2$ gas flowing inside the gas supply pipe 320 are adjusted by the MFCs 312 and 322, and the flow rate-adjusted $WF_6$ gas and $H_2$ gas are supplied into the process chamber 201 via the gas supply holes 410a and 420a of the nozzles 410 and 420 and are exhausted via the exhaust pipe 231. In this case, the $WF_6$ gas and the $H_2$ gas are supplied onto the wafer 200. That is, a surface of the wafer 200 is exposed to the $WF_6$ gas and the $H_2$ gas. At the same time, the valves 514 and 524 are opened to supply $N_2$ gas into the carrier gas supply pipes 510 and 520. A flow rate of the $N_2$ gas flowing inside the carrier gas supply pipes 510 and 520 is adjusted by the MFCs 512 and 522, and the flow rate-adjusted $N_2$ gas is supplied into the process chamber 201 together with the $WF_6$ gas or the $H_2$ gas and exhausted via the exhaust pipe 231. In this case, the valve 534 is opened to supply $N_2$ gas into the carrier gas supply pipe 530 so as to prevent the $WF_6$ gas and the $H_2$ gas from flowing into the nozzle 430. The $N_2$ gas is supplied into the process chamber 201 via the gas supply pipe 330 and the nozzle 430 and exhausted via the exhaust pipe 231.

In this case, the pressure in the process chamber 201 is adjusted to be equal to a pressure (e.g., 20 Pa) that is within, for example, a range of 10 to 30 Pa, by appropriately controlling the APC valve 243. A supply rate of the $WF_6$ gas controlled by the MFC 312 is set, for example, to be within a range of 0.1 g/min to 1.0 g/min, and a supply flow rate of the $H_2$ gas controlled by the MFC 322 is set, for example, to be within a range of 0.1 sccm to 0.5 sccm but may be determined according to a desired film thickness. A duration for which each of the $WF_6$ gas and the $H_2$ gas is supplied onto the wafer 200, i.e., a gas supply time (irradiation time), is determined according to a desired film thickness. In this case, the temperature of the heater 207 is set to be substantially the same as that in the first film forming process. By performing processing in-situ at the temperature that is substantially the same as that in the first film forming process, a process time may be reduced and the productivity of manufacturing a semiconductor device may be increased.

The $WF_6$ gas and the $H_2$ gas supplied into the process chamber 201 react with each other in a gas-phase state (gas-phase reaction) or on a surface of the wafer 200 to form a second α-tungsten (W) layer on the first α-tungsten (W) layer formed on the wafer 200. Here, the α-tungsten (W) layer may be understood as a continuous layer formed of α-tungsten (W), a discontinuous layer formed of α-tungsten (W), or an amorphous tungsten (W) layer obtained by overlapping the continuous layer and the discontinuous layer. The α-tungsten (W) layer may contain fluorine (F) included in $WF_6$ molecules. The α-tungsten (W) layer may be grown to a desired film thickness by controlling (adjusting) process conditions, such as the supply flow rates, the supply time and/or the like, of the $WF_6$ gas and the $H_2$ gas, the durations for which the $WF_6$ gas and the $H_2$ gas are supplied, etc.

As described above, in the case of a gas-phase reaction such as the second film forming process, a void, a seam, or both are likely to occur in a very fine groove because a film is crystallized. The inventors of the present invention have found that whether a film is to become crystallized or not depends on a thickness of the film as described above. Thus, in the present embodiment, supply of gases is stopped in a gas second film forming process before a thickness of a tungsten (W) film becomes equal to a film thickness causing the tungsten (W) film to become crystallized. Also, a film thickness that does not cause the tungsten (W) film to become crystallized is preferably greater than 0 nm and equal to or less than 4 nm. Here, the film thickness is set to be within a range of 3 nm to 4 nm.

[Process of Removing Residual Gas]

After the second α-tungsten (W) layer is formed to the predetermined thickness, the valves 314 and 324 are closed to stop the supply of the $WF_6$ gas and the $H_2$ gas. In this case, the inside of the process chamber 201 is vacuum-exhausted by the vacuum pump 246 while the APC valve 243 is open, and the $WF_6$ gas and the $H_2$ gas (that do not react or that have contributed to the formation of the second α-tungsten (W) layer) remaining in the process chamber 201 are removed from the inside of the process chamber 201. That is, the $WF_6$ gas and the $H_2$ gas (that do not react or that have contributed to the formation of the second α-tungsten (W) layer) remaining in a space, in which the wafer 200 on which the second α-tungsten (W) layer is formed is present, are removed. In this case, $N_2$ gas is continuously supplied into the process chamber 201 while the valves 514, 524 and 534 are open. The $N_2$ gas acts as a purge gas to increase the effect of removing the $WF_6$ gas and the $H_2$ gas (that do not react or that have contributed to the formation of the second α-tungsten (W) layer) remaining in the process chamber 201 from the process chamber 201. In this case, when a byproduct is generated in the process chamber 201 in the second film forming process, the byproduct is also removed from the process chamber 201.

In this case, the gas remaining in the process chamber 201 may not be completely removed and the inside of the process chamber 201 may not be completely purged, similar to the first reducing gas supply process performed in the first film forming process and the residual gas removing process performed after the metal-containing gas supply process.

[Performing a Cycle a Predetermined Number of Times]

By performing the first film forming process and the second film forming process described above only $n_2$ times in the time-division manner, an α-tungsten (W) film which is a stacked layer obtained by alternately stacking a first α-tungsten (W) layer and a second α-tungsten (W) layer at a nano-level is formed on the wafer 200 to a predetermined thickness. Here, '$n_2$' denotes an integer that is equal to or greater than 1. The step described above is preferably repeatedly performed a plurality of times.

[Annealing Process]

After the films are formed, the formed α-tungsten (W) film is preferably annealed (heated) in a nitrogen ($N_2$) atmosphere (PDA: Post Deposition Anneal). The annealing may be also performed in the process chamber 201 after the second film forming process is performed, or may be performed by moving the wafer 200 to another annealing device. A method of annealing the α-tungsten (W) film in the process chamber 201 after it is formed will be described below.

The inside of the process chamber 201 is controlled to be an $N_2$ atmosphere by continuously supplying $N_2$ gas into the process chamber 201 while the valves 514, 524 and 534 are open. In this case, the temperature of the heater 207 is set such that the wafer 200 has a temperature (e.g., 600° C.) that is, for example, within a range of 500° C. to 1,200° C. This is because the α-tungsten (W) film is not crystallized when the temperature of the wafer 200 is less than 500° C. and the wafer 200 begins to dissolve when the temperature of the wafer 200 is greater than 1,200° C. The α-tungsten (W) film formed on the wafer 200 may be crystallized to be changed into a crystalline tungsten (W) film by annealing the α-tungsten (W) film.

[Purging and Atmospheric Pressure Recovery]

After the α-tungsten (W) film formed on the wafer 200 is crystallized to be changed into the crystalline tungsten (W) film, $N_2$ gas is supplied into the process chamber 201 via the gas supply pipes 510, 520 and 530 and exhausted via the exhaust pipe 231 while the valves 514, 524 and 534 are open. The $N_2$ gas acts as a purge gas to purge the inside of the process chamber 201 with an inert gas, thereby removing any gas or by-products remaining in the process chamber 201 from the process chamber 201 (purging). Thereafter, an atmosphere in the process chamber 201 is replaced with the inert gas (inert gas replacement), and the pressure in the process chamber 201 is thus returned to normal pressure (atmospheric pressure recovery).

[Boat Unloading and Wafer Discharging]

The seal cap 219 is moved downward by the boat elevator 115 to open the lower end of the manifold 209. Also, the processed wafers 200 are unloaded to the outside of the process chamber 201 from the lower end of the manifold 209 while being supported by the boat 217 (boat unloading). Thereafter, the processed wafers 200 are unloaded from the boat 217 (wafer discharging).

Next, the relationship between the first film forming process and the second film forming process according to the present embodiment and a film to be formed will be described with reference to FIGS. 5A to 5F below.

Figure 5A:
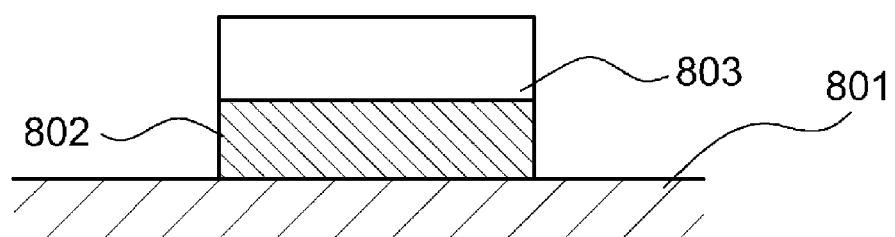

FIG. 5A is a diagram illustrating a state of a loaded wafer 801, in which the pillars forming a very fine groove and the like are not shown and only a formed film is shown. A silicon oxide ($SiO_2$) layer 802 is formed as a charge accumulation layer on the wafer 801, and a titanium nitride (TiN) layer 803 is formed as a barrier metal layer on the silicon oxide ($SiO_2$) layer 802. A tantalum nitride (TaN) layer may be used as the barrier metal layer rather than the TiN layer 803. An adhesion between a tungsten (W) layer to be formed according to the present invention and the $SiO_2$ layer 802 may be increased using the barrier metal layer.

Figure 5B:
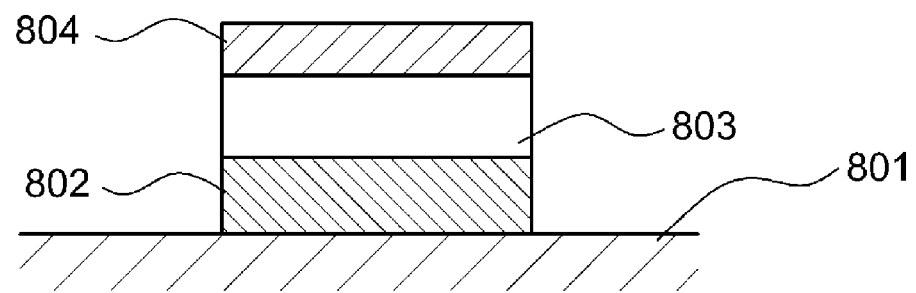

FIG. 5B is a diagram illustrating a state in which a first film forming process according to an embodiment of the present invention is performed on the wafer 801, that is in the state of FIG. 5A. A first α-tungsten (W) layer is formed as a seed layer 804 in the first film forming process. Since the seed layer 804 is formed by performing the first film forming process, the seed layer 804 has a smooth surface. Thus, the roughness of a film to be formed on the seed layer 804 may be enhanced.

Figure 5C:
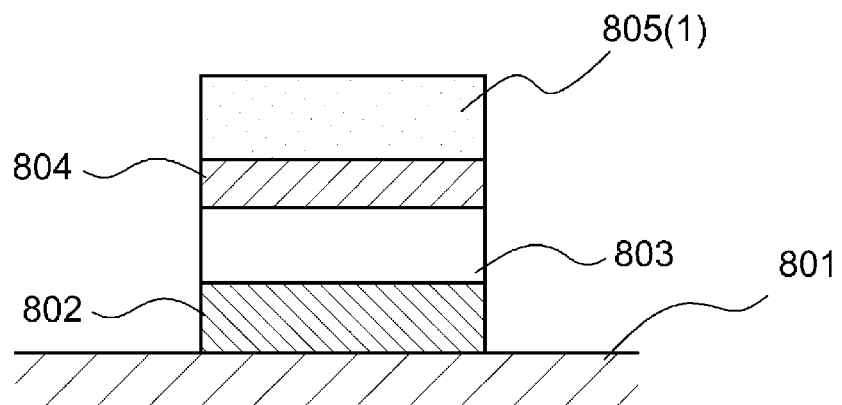

FIG. 5C illustrates a state in which a second film forming process according to an embodiment of the present invention is performed on the wafer 801 that is in the state of FIG. 5B. An amorphous layer [805(1)] which is a second α-tungsten (W) film is formed on the seed layer 804. Since the second α-tungsten (W) film is an amorphous layer that is not crystallized, the second α-tungsten (W) film may be formed even in a fine groove without causing a void, a seam, or both to occur.

As described above, a metal film used as an electrode, wire, etc. is required to have a low resistance value. The amorphous layer [805(1)] does not contain residues generated when gases are alternately supplied and thus has a lower resistance value than that of a thin film 806 which will be described below. Thus, a ratio of the amorphous layer [805(1)] to a metal film to be formed is increased to lower a whole resistance value of the metal film. In this case, a film is formed to a maximum thickness that is within a non-crystalline film thickness range of an amorphous layer 805. Thus, a low-resistance film may be formed at a faster speed than when a film is formed by alternately supplying gases as in the first film forming process.

Figure 5D:
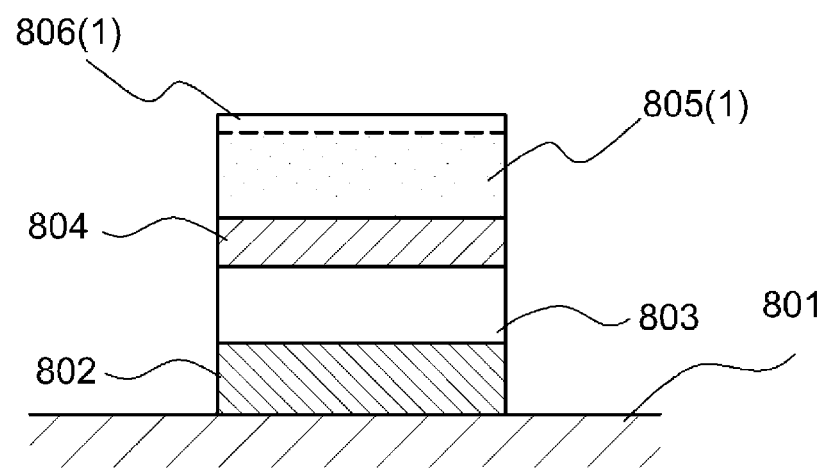

FIG. 5D illustrates a state in which the first film forming process is performed on the wafer 801 of FIG. 5C. A thin film [806(1)] which is a first α-tungsten (W) layer is formed on the amorphous layer [805(1)]. In this case, boron (B) atoms introduced into the thin film [806(1)] move to the amorphous layer [805(1)] below the thin film [806(1)] and suppress the amorphous layer [805(1)] from being crystallized. Also, the thin film [806(1)] is present between an amorphous layer [805(2)] to be formed on the thin film [806(1)] by thereafter performing the second film forming process and the amorphous layer [805(1)], and thus suppresses the amorphous layer [805(1)] from being crystallized when the amorphous layer [805(2)] is formed.

Figure 5E:
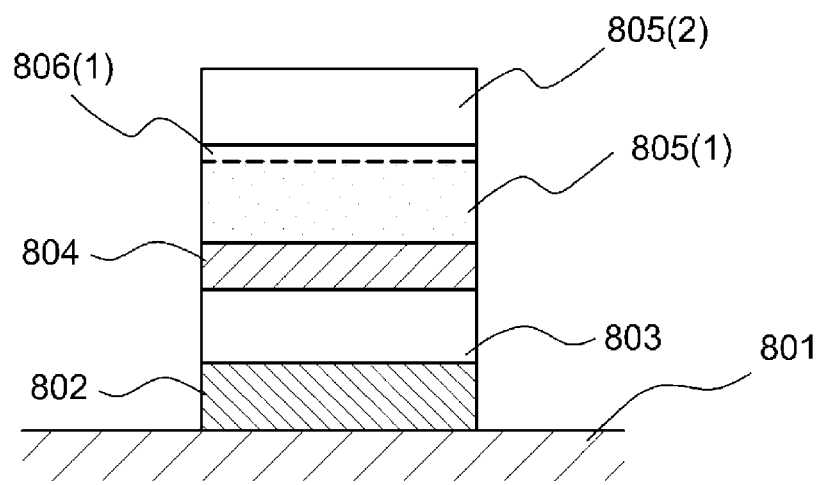

FIG. 5E illustrates a state in which the second film forming process is performed on the wafer 801 that is in the state of FIG. 5D. The amorphous layer [805(2)] which is a second α-tungsten (W) layer is formed on the thin film [806(1)].

Figure 5F:
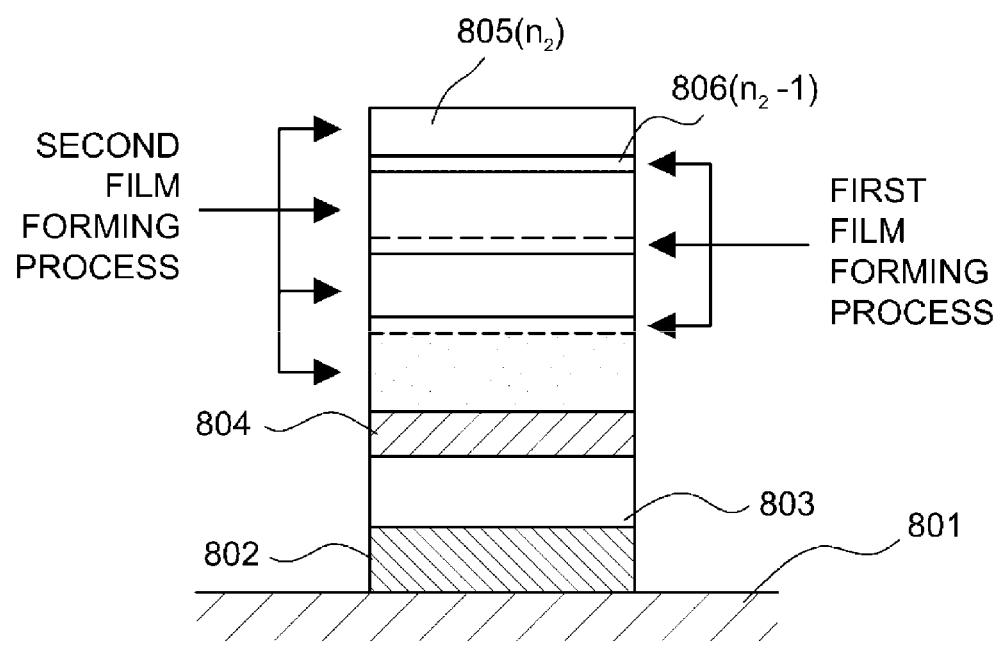

FIG. 5F illustrates a tungsten (W) film formed by repeatedly performing the first film forming process and the second film forming process. On the seed layer 804, an amorphous layer [805($n_2$)] formed in the second film forming process and a thin film[806($n_2$-1)] formed in the first film forming process are alternately formed. An α-tungsten (W) film is formed to a desired thickness by repeatedly performing the first film forming process, the second film forming process and the process of forming the seed layer 804 $n_2$ times.

The amorphous layer 805 is preferably an uppermost layer of the α-tungsten (W) film to form a film to a desired thickness. The thin film 806 is formed by alternately supplying a plurality of gases as described above, and a maximum film thickness of the thin film 806 is about 2 angstrom( ). Thus, the amorphous layer 805 formed using a gas-phase reaction has a thickness of about 3 nm to 4 nm as will be described below. Thus, if a thickness of a thin film is controlled to be several tens of nm, it takes a considerable time to form a film using the first film forming process and thus an amorphous film is formed using a combination of the first film forming process and the second film forming process. Accordingly, an amorphous film may be efficiently formed to a desired thickness.

Figure 6A:
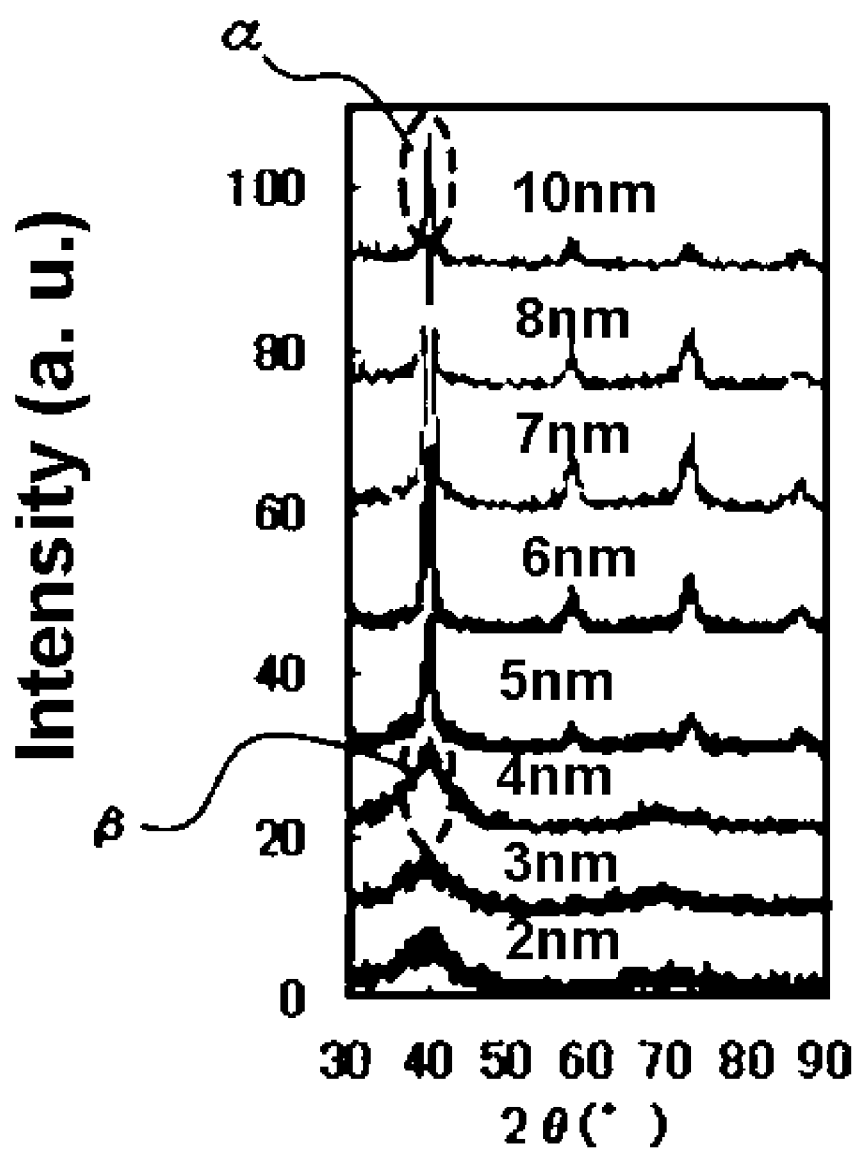
Figure 6B:
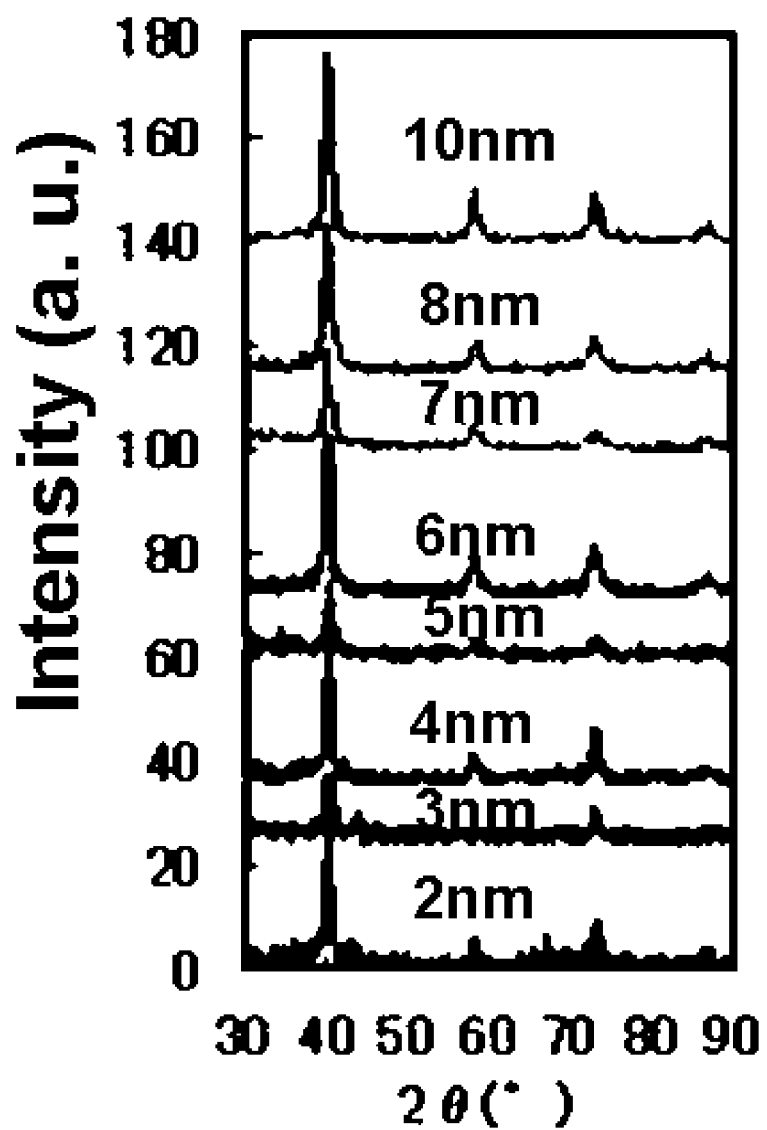

FIGS. 6A and 6B are graphs illustrating results of evaluating a crystal structure of a formed film, based on X-ray analysis. FIG. 6A illustrates a result of evaluating an amorphous layer formed in the second film forming process. FIG. 6B illustrates a result of evaluating the amorphous layer of FIG. 6A when it is heated to 600° C. In FIGS. 6A and 6B, the horizontal axes each denote an angle when measurement is performed and the vertical axes denote intensity. Also, "2 nm" to "10 nm" denote film thicknesses. In the evaluations, an angle of steep inclination, e.g., an angle α, denotes a state in which a film is crystallized due to high bond strength and an angle of slight inclination, e.g., an angle β, denotes a state in which the film is amorphous.

Referring to FIG. 6A, the film was not crystallized at a film thickness of 4 nm or less. Thus, in the second film forming process, an amorphous layer is preferably formed to a thin thickness that is greater than 0 m and less than 4 nm. Referring to FIG. 6B, the amorphous layer was crystallized from top to bottom when it was heated to 600° C. Thus, when a tungsten (W) film is annealed after it is formed, the tungsten (W) film may be crystallized to be modified into a film with high bond strength.

The reason why a film is not crystallized at a film thickness of 4 nm or less will be described below. A film is crystallized, accompanied by movement of atoms. In this case, atoms adjacent to an interface between films should move in a three-dimensional (3D) structure but high energy is required for the movement. However, a ratio of the number of atoms bound to the interface between the films to the number of atoms to become crystallized and stabilized is high. Thus, the film seems to be difficult to become crystallized unless external energy such as heat energy is provided. However, the greater the thickness of a film, the greater the number of atoms in the film are free from the interface between the films and the easier the film may be crystallized due to an action causing the atoms to be arranged in a stable array. Thus, even if a large amount of atoms move (condense), the atoms may be easily arranged in the 3D structure. Due to this mechanism, it is considered that a film may not be crystallized until the thickness thereof increases to a predetermined thickness and may be crystallized when the thickness of the film exceeds the predetermined thickness. Also, the crystallization of the film seems to be influenced by impurities contained in the film or the like.

Figure 7:
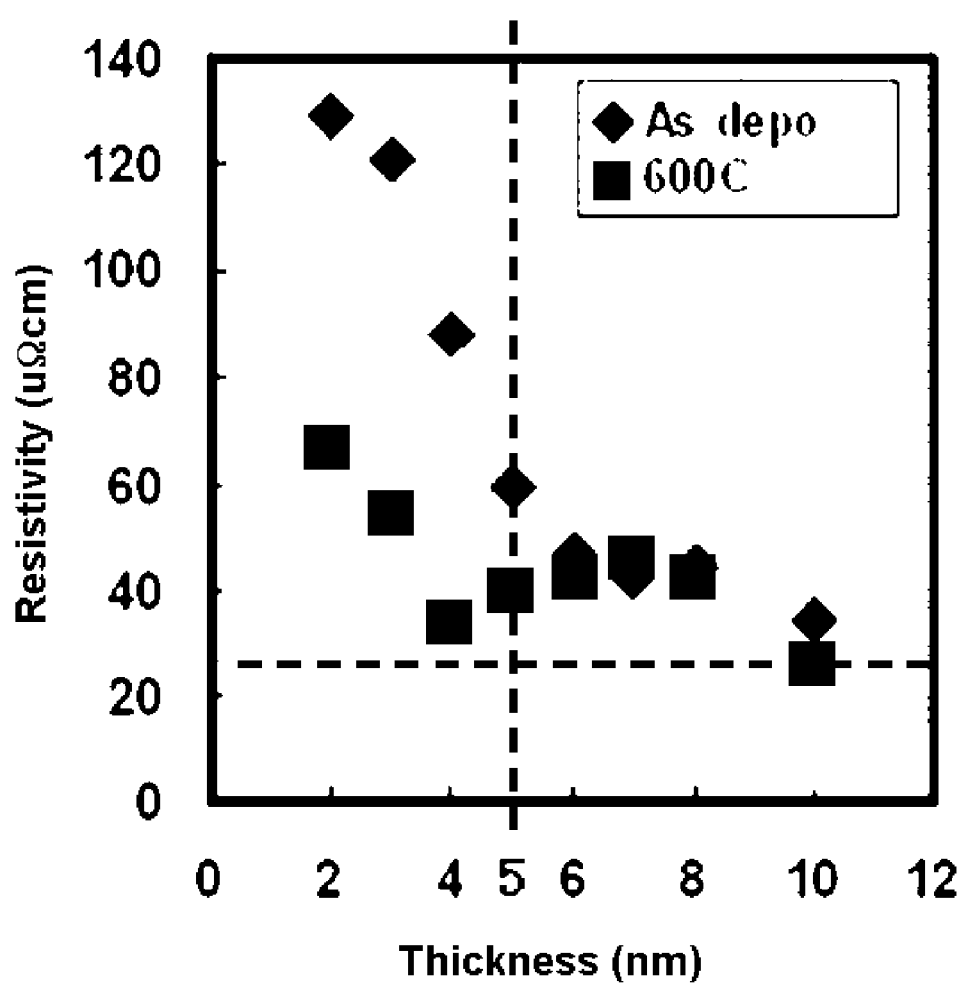
FIG. 7 is a graph illustrating the quality of a film formed according to another embodiment of the present invention.

FIG. 7 is a graph illustrating the relationship between film thickness and resistivity. In FIG. 7, '♦' denotes data of an amorphous film (second α-tungsten (W) film) and '■' denotes data of the amorphous film after the amorphous film is annealed. As apparent from FIG. 7, the resistivity of the amorphous layer increases when the thickness of the amorphous layer is less than 5 nm and decreases when the thickness of the amorphous layer is 5 nm or more. If the amorphous layer is annealed, the thickness of the amorphous layer is not limited to 5 nm or more and the resistivity of the amorphous layer decreases even when the thickness of the amorphous layer is less than 5 nm. This is because an increase in the number of gaps (openings) between crystals causes an increase in the resistance of the amorphous layer when the amorphous layer is thick.

As apparent from FIG. 7, in the case of an amorphous layer, the thickness of the amorphous layer is preferably 5 nm or more to reduce the resistivity thereof. However, when the thickness of the amorphous layer is 5 nm or more, the amorphous layer is crystallized and thus a void or a seam is highly likely to occur as described above. Therefore, when the amorphous layer is formed to a thickness of less than 5 nm to cause a void or a seam not to occur, the resistivity of the amorphous layer may be lowered by annealing the amorphous layer as described above.

When the amorphous layer 805 is annealed, the amorphous layer 805 is crystallized to cause the tungsten (W) film to have a dense structure. For example, when the amorphous layer 805 is annealed at 600° C., the amorphous layer 805 is crystallized as shown in FIG. 6B.

Figure 8:
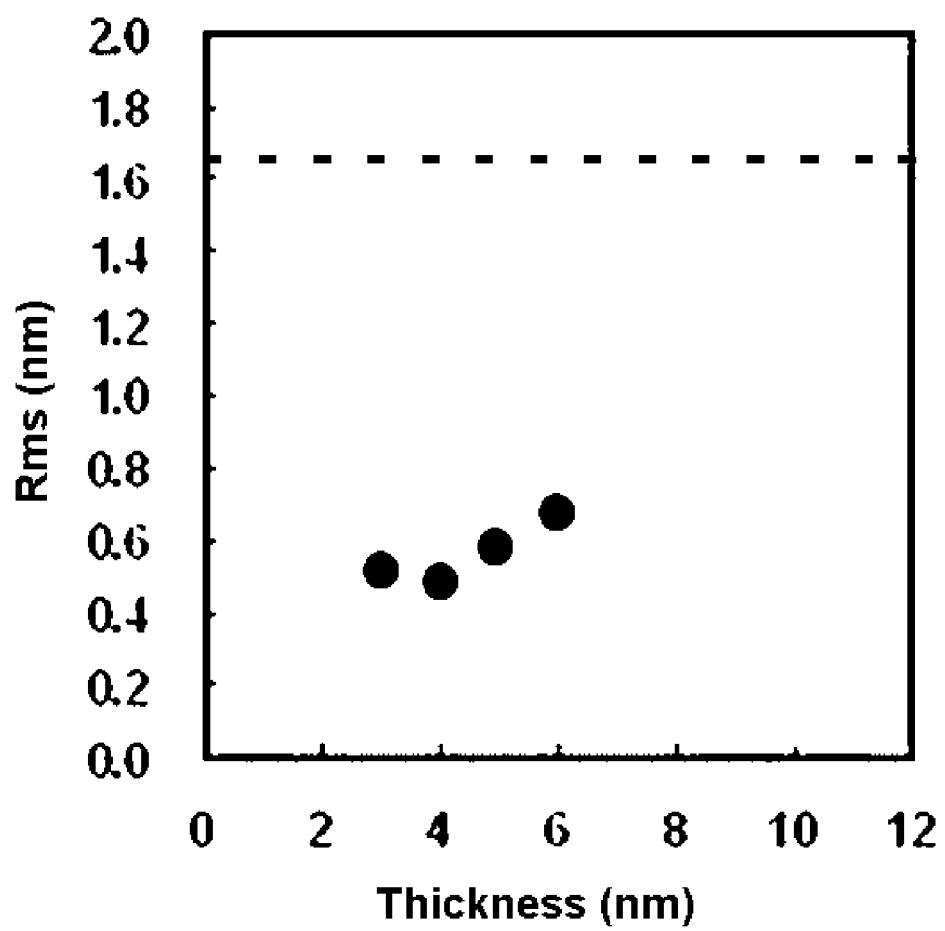
FIG. 8 is a graph illustrating the quality of a film formed according to another embodiment of the present invention.

FIG. 8 illustrates data representing the relationship between an amorphous layer and roughness thereof. The plot of FIG. 8 shows the roughness of the amorphous film (α-tungsten (W) film) formed according to the present embodiment, in which a broken line denotes the roughness of a general film formed using the technique employed in the second film forming process. The roughness of the amorphous film formed according to the present embodiment is less than that of the general film. That is, a film according to the present embodiment may be flatter and denser than a film formed using a general technique.

(3) Effect of the Present Embodiment

According to the present invention, an amorphous tungsten (W) film is formed to a desired thickness using a combination of two types of amorphous tungsten (W) layers formed using different techniques, and annealed to form a crystalline tungsten (W) film having lower roughness and resistivity in a very fine groove with a narrow opening.

Other Embodiments

The present invention is not limited to the embodiment described above and may be embodied in different forms without departing from the scope of the invention.

A case in which an amorphous film and a crystalline film are a tungsten (W) film has been described in the previous embodiment. The present invention is, however, not limited to the previous embodiment and is effectively applicable to forming a film such that the film is crystallized at a predetermined film thickness or more when the film is formed by simultaneously supplying a plurality of process gases to a low-temperature region of 200° C. or less and is not crystallized (i.e., is amorphous) when the film is formed by supplying a plurality of gases in the time-division manner. For example, the present invention is also preferably applicable to forming a metal nitride film (metal nitride) including a metal element such as tungsten (W), titanium (Ti), tantalum (Ta), molybdenum (Mo), or zinc (Zn); a metal carbide film (metal carbide) including a metal element such as tungsten (W), titanium (Ti), tantalum (Ta), molybdenum (Mo), or zinc (Zn); a metal film formed of copper (Cu), ruthenium (Ru), or aluminum (Al); or a film obtained from a combination thereof.

For example, the metal nitride film or the metal carbide film may be a metal nitride-based film or a metal carbide-based film (such as a WN film, a TiN film, a TaN film, a MoN film, a ZnN film, a WC film, a TiC film, a TaC film, a MoC film, a ZnC film, a WCN film, a TiCN film, a TaCN film, a MoCN film, a ZnCN film, etc.), a metal film (such as a Cu film, a Ru film, an Al film, etc.), or a film obtained from a combination thereof.

Also, when the metal nitride film or the metal carbide film described above is formed, not only $WF_6$ but also a halide, such as tungsten hexechloride ($WCl_6$), titanium tetrafluoride ($TiF_4$), titanium tetrachloride ($TiCl_4$), tantalum pentafluoride ($TaF_5$), tantalum pentachloride ($TaCl_5$), molybdenum pentafluoride ($MoF_5$), molybdenum pentachloride ($MoCl_5$), zinc dichloride ($ZnCl_2$), zinc difluoride ($ZnF_2$), etc., may be used.

As a first reducing gas, not only $B_2H_6$ gas which is a boron (B)-containing gas but also $Si_2H_6$ gas or $SiH_4$ gas which is a silicon-containing gas (silan-based gas) may be used.

As a second reducing gas, not only $H_2$ gas but also deuterium ($D_2$) gas which is a hydrogen (H)-containing gas that does not contain other elements may be used.

Although a case in which $H_2$ gas is used as a reducing gas in the second film forming process has been described in the present embodiment, the present invention is not limited thereto and, for example, $B_2H_6$ gas, $Si_2H_6$ gas, $SiH_4$ gas, or the like may be used as a reducing gas in the second film forming process.

In addition to $N_2$ gas, a rare gas such as argon (Ar) gas, helium (He) gas, neon (Ne) gas, or xenon (Xe) gas may be used as an inert gas.

The above embodiment, modified examples and application examples may be used in appropriate combination. Also, in this case, process conditions may be substantially the same as those in the previous embodiment.

A process recipe (program including process conditions, a process order, etc.) used to form such various thin films are preferably individually prepared according to the details of substrate processing (the type, composition, quality and thickness of a thin film to be formed, a process order, process conditions, etc.). When substrate processing begins, an appropriate process recipe is preferably selected among the plurality of process recipes according to the details of substrate processing. Specifically, a plurality of process recipes that are individually prepared according to the details of substrate processing are preferably stored (installed) beforehand in the memory device 121c of the substrate processing apparatus via an electrical communication line or a recording medium (e.g., the external memory device 123) storing the process recipes. When substrate processing begins, the CPU 121a of the substrate processing apparatus preferably selects an appropriate process recipe among the plurality of process recipes stored in the memory device 121c according to the details of substrate processing.

Accordingly, with one substrate processing apparatus, various types of multi-purpose thin films can be reproducibly formed in various compositions, to have various qualities, and to various thicknesses. Also, it is possible to decrease a burden on an operator's manipulation (for example, when a processing sequence, conditions, etc. are input) and to immediately begin substrate processing without causing errors in manipulation.

The process recipes described above are not limited to newly prepared process recipes. For example, the process recipes may be prepared by changing process recipes that have already been installed in a substrate processing apparatus. When a process recipe is changed, a process recipe according to the present invention may be installed in the existing substrate processing apparatus via an electrical communication line or a recording medium storing the process recipe or the process recipe may be replaced with a process recipe according to the present invention by manipulating an input/output device of the existing substrate processing apparatus.

In the previous embodiment, a case in which a film is formed using a process furnace which is a batch type vertical substrate processing apparatus capable of processing a plurality of substrates at a time and which has a structure in which process gas supply nozzles are installed in one reaction tube and an exhaust port is installed below the reaction tube has been described. The present invention is, however, applicable to a case in which a film is formed using a process furnace having a different structure. For example, the present invention is also applicable to a case in which a film is formed using a process furnace in which two reaction tubes with a concentric cross-section (an external reaction tube is referred to as an outer tube and an internal reaction tube is referred to as an inner tube) are installed and a process gas flows from a nozzle installed in the inner tube to an exhaust port that is open at a location that is a sidewall of the outer tube and opposite to the nozzle with a substrate therebetween (a location that is axial-symmetrical to the nozzle). Otherwise, the process gas may be supplied via a gas supply hole that is open in a sidewall of the inner tube rather than the nozzle installed in the inner tube. In this case, the exhaust port may be open in the outer tube according to the height of a plurality of substrates accommodated to be stacked in a process chamber. The exhaust port may have a hole shape or a slit shape.

Although a case in which a film is formed using a batch type vertical substrate processing apparatus capable of processing a plurality of substrates at a time has been described in the previous embodiment, the present invention is not limited thereto and is preferably applicable to a case in which a thin film is formed using a single-wafer type substrate processing apparatus capable of processing one or several substrates at a time. Also, although a case in which a thin film is formed using a substrate processing apparatus including a hot wall type process furnace has been described in the previous embodiment, the present invention is not limited thereto and is preferably applicable to a case in which a thin film is formed using a substrate processing apparatus including a cold wall type process furnace. In this case, process conditions may be substantially the same as those in the previous embodiment.

Figure 10:
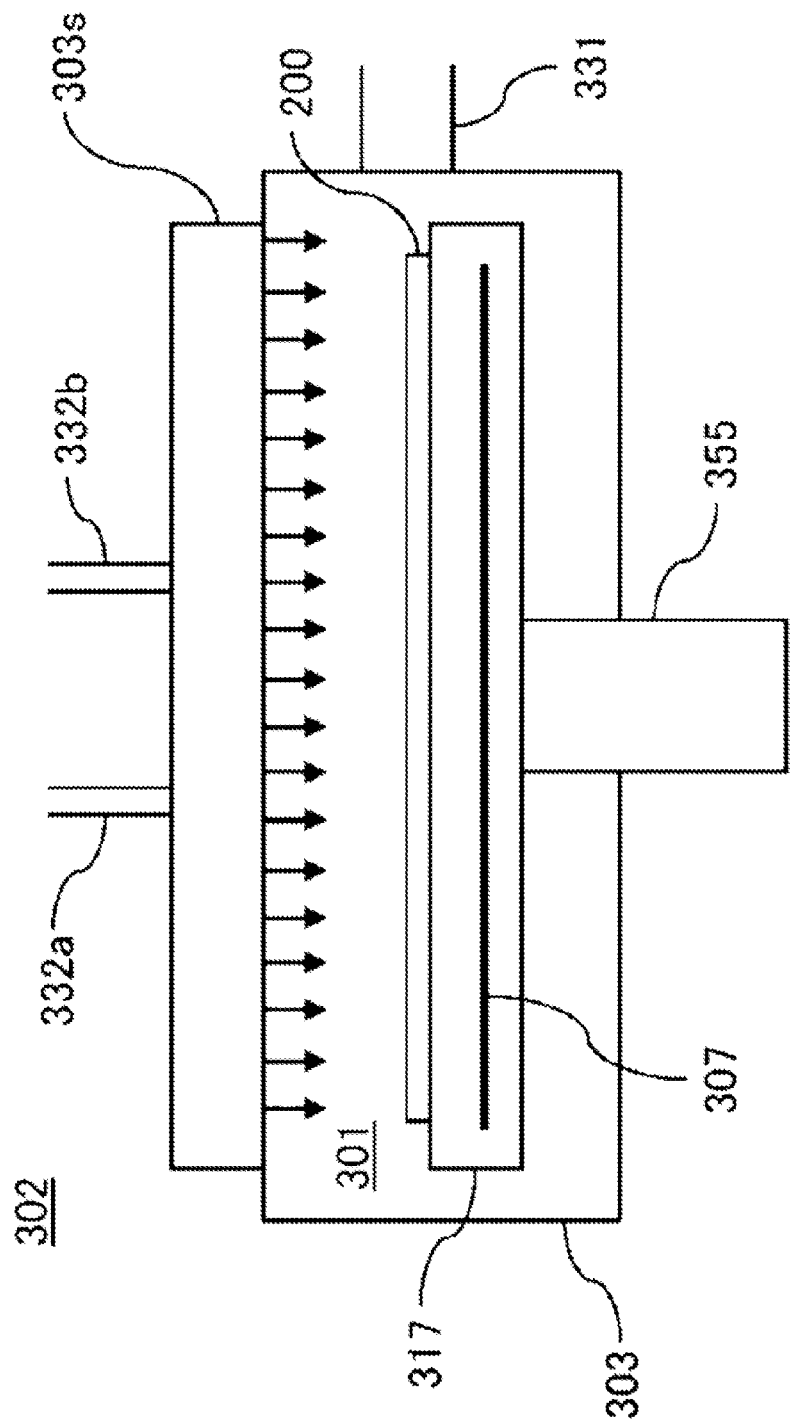
FIG. 10 is a schematic configuration diagram of a process furnace of a substrate processing apparatus according to another embodiment of the present invention, in which a longitudinal sectional view of a process furnace portion is illustrated.

The present invention is also preferably applicable to a case in which a film is formed using, for example, a substrate processing apparatus including, for example, a process furnace 302 illustrated in FIG. 10. The process furnace 302 includes a process container 303 forming a process chamber 301, a shower head 303s configured to supply a gas into the process chamber 301 in the form of a shower, a support table 317 configured to support one or several wafers 200 in a horizontal posture, a rotation shaft 355 configured to support the support table 317 from below, and a heater 307 installed in the support table 317. A gas supply port 332a for supplying a source gas as described above and a gas supply port 332b for supplying a reactive gas are connected to an inlet (gas introduction holes) of the shower head 303s. A source gas supply system such as that in the previous embodiment is connected to the gas supply port 332a. A reactive gas supply system such as that in the previous embodiment is connected to the gas supply port 332b. A gas dispersion plate is installed at an outlet (gas discharge hole) of the shower head 303s to supply a gas into the process chamber 301 in the form of a shower. In the process container 303, an exhaust port 331 is installed to exhaust the inside of the process chamber 301. An exhaust system similar to the exhaust system described above is connected to the exhaust port 331.

Figure 9:
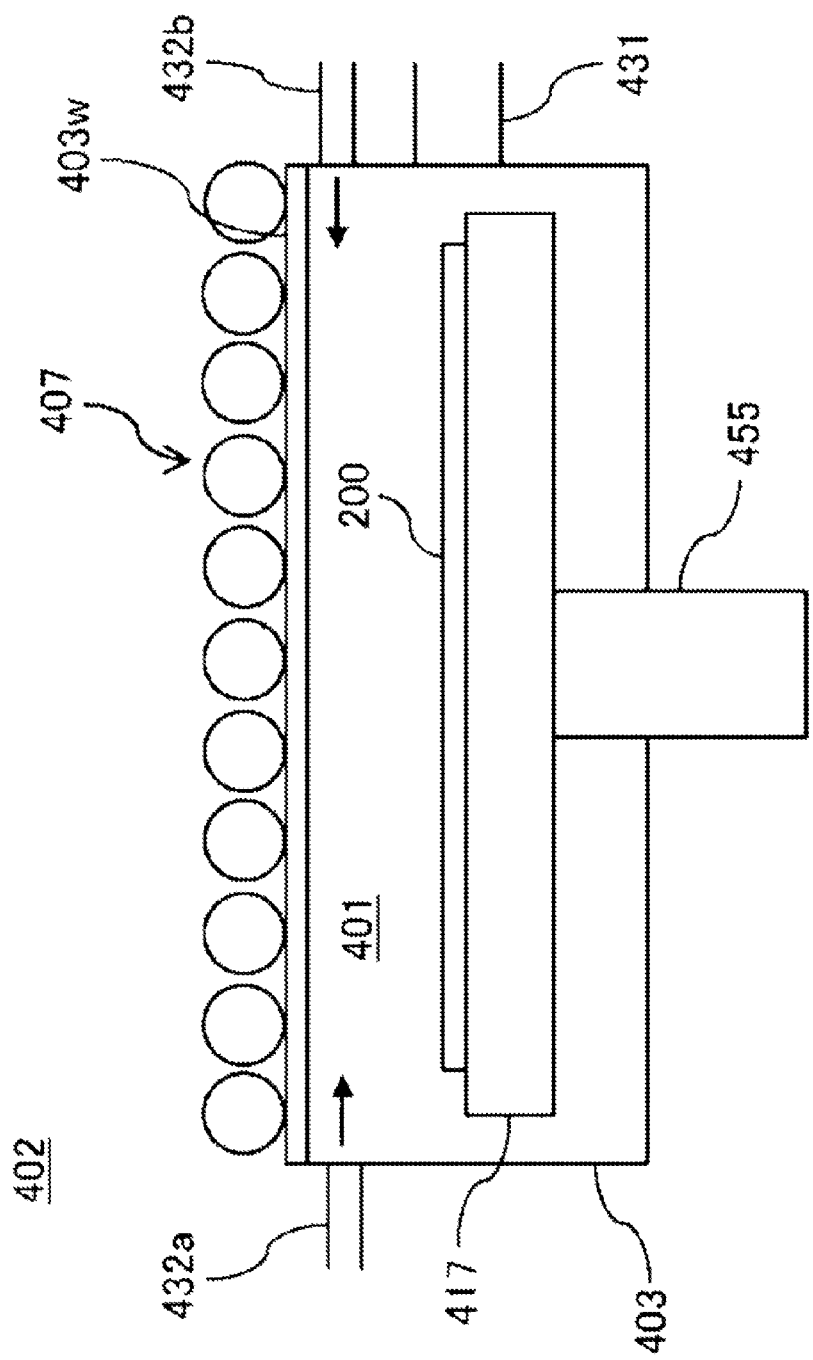
FIG. 9 is a schematic configuration diagram of a process furnace of a substrate processing apparatus according to another embodiment of the present invention, in which a longitudinal sectional view of a process furnace portion is illustrated.

Also, the present invention is also preferably applicable to a case in which a film is formed using, for example, a substrate processing apparatus including a process furnace 402 illustrated in FIG. 9. The process furnace 402 includes a process container 403 forming a process chamber 401, a support table 417 configured to support one or several wafers 200 in a horizontal posture, a rotation shaft 455 configured to support the support table 417 from below, a lamp heater 407 configured to irradiate light toward the wafers 200 in the process container 403, and a quartz window 403w allowing light generated from the lamp heater 407 to pass therethrough. A gas supply port 432a for supplying a source gas as described above and a gas supply port 432b a source gas as described above are connected to the process container 403. A source gas supply system such as that in the previous embodiment is connected to gas supply port 432a. A reactive gas supply system such as that in the previous embodiment is connected to the gas supply port 432b. In the process container 403, an exhaust port 431 is installed to exhaust the inside of the process chamber 401. An exhaust system similar to the exhaust system described above is connected to the exhaust port 431.

When the substrate processing apparatuses are used, a film may be also formed using a sequence and process conditions that are substantially the same as those in the previous embodiment.

The present invention provides a method of manufacturing a semiconductor device, which is capable of forming a film having low roughness and resistivity by suppressing a void from being generated during the forming of the film, a substrate processing apparatus and a program.

Exemplary Embodiments of the Present Invention

The following supplementary notes are added herein as exemplary embodiments of the present invention.

Supplementary Note 1

According to one aspect of the present invention, there is provided a semiconductor device manufacturing method or a substrate processing method, including:

(a) forming an amorphous metal film on a substrate while maintaining the substrate at a first temperature by performing steps (a-1) and (a-2) in a time-divisional manner (asynchronously, intermittently, temporally separated pulses, or a pulse-wise manner), wherein the step (a-1) includes supplying in the time-divisional manner a metal-containing gas and a first reducing gas to the substrate a predetermined number of times to form a first amorphous metal film on the substrate, and the step (a-2) includes simultaneously supplying the metal-containing gas and a second reducing gas to the substrate having the first amorphous metal film formed thereon to form a second amorphous metal film on the first amorphous metal film; and (b) heating the substrate having the amorphous metal film formed thereon to a second temperature higher than the first temperature.

Supplementary Note 2

In the method of Supplementary note 1, the first temperature is in a range of 100° C. to 250° C., preferably, a range of 150° C. to 200° C., and more preferably, 200° C., and the second temperature is in a range of 500° C. to 1,200° C., preferably, a range of 500° C. to 800° C., and more preferably, 600° C.

Supplementary Note 3

In the method of Supplementary note 1 or 2, the steps (a-1), (a-2) and (b) are preferably performed in-situ.

Supplementary Note 4

In the method of any one of Supplementary notes 1 to 3, preferably, a metal-containing film is formed on a processing surface of the substrate having the amorphous metal film thereon, and is not formed on a back surface and a side surface of the substrate.

Supplementary Note 5

In the method of Supplementary note 4, the metal-containing film is preferably a titanium nitride film.

Supplementary Note 6

In the method of any one of Supplementary notes 1 to 5, the first reducing gas is preferably a boron-containing gas or a silicon-containing gas, and the second reducing gas is preferably a hydrogen-containing gas free of other elements.

Supplementary Note 7

In the method of Supplementary note 6, the first reducing gas is preferably diborane ($B_2H_6$) gas and the second reducing gas is preferably hydrogen ($H_2$) gas.

Supplementary Note 8

In the method of any one of Supplementary notes 1 to 7, the metal-containing gas is preferably a tungsten-containing gas, the first amorphous metal layer and the second amorphous metal layer are preferably amorphous tungsten layers, and the amorphous metal film is preferably an amorphous tungsten film.

Supplementary Note 9

In the method of Supplementary note 8, the tungsten-containing gas is preferably a halide containing tungsten, such as tungsten hexafluoride ($WF_6$).

Supplementary Note 10

In the method of any one of Supplementary notes 1 to 9, during the step (b), the substrate having the amorphous metal film thereon is preferably heated to crystallize a portion of the amorphous metal layer.

Supplementary Note 11

In the method of any one of Supplementary notes 1 to 10, the substrate is preferably a silicon substrate, a metal-containing film is preferably formed on a portion of a surface of the substrate, and the first amorphous metal film is preferably formed as a first layer in contact with the metal-containing film and silicon constituting the silicon substrate and the second amorphous metal film is preferably formed as a final layer during the step (a).

Supplementary Note 12

According to another aspect of the present invention, there is provided a semiconductor device manufacturing method or a substrate processing method, the method including:

(a) forming an amorphous metal film on a silicon substrate having a processing surface with a metal-containing film thereon and a side surface and a back side without the metal-containing film by performing steps (a-1) and (a-2) in a time-divisional manner, wherein the step (a-1) includes supplying in the time-divisional manner a metal-containing gas and a first reducing gas to the substrate a predetermined number of times to form a first amorphous metal film on the substrate, and the step (a-2) includes simultaneously supplying the metal-containing gas and a second reducing gas to the substrate having the first amorphous metal film formed thereon to form a second amorphous metal film on the first amorphous metal film.

Supplementary Note 13

In the method of Supplementary note 12, the step (a) is performed while maintaining the substrate at a first temperature, and the method further includes (b) heating the substrate having the amorphous metal film formed thereon to a second temperature higher than the first temperature.

Supplementary Note 14

According to another aspect of the present invention, there is provided a substrate processing apparatus including:

a process chamber configured to accommodate a substrate;

a heater configured to heat the substrate in the process chamber;

a first gas supply system configured to supply a metal-containing gas to the substrate in the process chamber;

a second gas supply system configured to supply a first reducing gas to the substrate in the process chamber;

a third gas supply system configured to supply a second reducing gas to the substrate in the process chamber; and a controller configured to control the heater, the first gas supply system, the second gas supply system and the third gas supply system to perform:

(a) forming an amorphous metal film on the substrate while maintaining the substrate at a first temperature by performing steps (a-1) and (a-2) in a time-divisional manner, wherein the step (a-1) includes supplying in the time-divisional manner the metal-containing gas and the first reducing gas to the substrate a predetermined number of times to form a first amorphous metal film on the substrate, and the step (a-2) includes simultaneously supplying the metal-containing gas and the second reducing gas to the substrate having the first amorphous metal film formed thereon to form a second amorphous metal film on the first amorphous metal film; and (b) heating the substrate having the amorphous metal film formed thereon to a second temperature higher than the first temperature.

Supplementary Note 15

According to another aspect of the present invention, there is provided a substrate processing apparatus including:

a process chamber configured to accommodate a substrate;

a heater configured to heat the substrate in the process chamber;

a first gas supply system configured to supply a metal-containing gas to the substrate in the process chamber;

a second gas supply system configured to supply a first reducing gas to the substrate in the process chamber;

a third gas supply system configured to supply a second reducing gas to the substrate in the process chamber; and a controller configured to control the heater, the first gas supply system, the second gas supply system and the third gas supply system to form an amorphous metal film on the substrate placed in the process chamber by supplying the metal-containing gas and the first reducing gas to the substrate, which is a silicon substrate having a processing surface with a metal-containing film thereon and a side surface and a back side without the metal-containing film, a predetermined number of times in a time-divisional manner to form a first amorphous metal film on the substrate, and simultaneously supplying a predetermined number of times the metal-containing gas and the second reducing gas to the substrate having the first amorphous metal film formed thereon to form a second amorphous metal film on the first amorphous metal film.

Supplementary Note 16

According to another aspect of the present invention, there are provided a program or a non-transitory computer readable recording medium storing the program, the program causing a computer to perform:

(a) forming an amorphous metal film on a substrate while maintaining the substrate at a first temperature by performing sequences (a-1) and (a-2) in a time-divisional manner (asynchronously, intermittently, temporally separated pulses, or a pulse-wise manner), wherein the sequence (a-1) includes supplying in the time-divisional manner a metal-containing gas and a first reducing gas to the substrate a predetermined number of times to form a first amorphous metal film on the substrate, and the sequence (a-2) includes simultaneously supplying the metal-containing gas and a second reducing gas to the substrate having the first amorphous metal film formed thereon to form a second amorphous metal film on the first amorphous metal film; and (b) heating the substrate having the amorphous metal film formed thereon to a second temperature higher than the first temperature;

and a non-transitory computer readable recording medium storing the program.

Supplementary Note 17

According to another aspect of the present invention, there are provided a program or a non-transitory computer readable recording medium storing the program, the program causing a computer to perform:

(a) forming an amorphous metal film on a silicon substrate having a processing surface with a metal-containing film thereon and a side surface and a back side without the metal-containing film by performing sequences (a-1) and (a-2) in a time-divisional manner (asynchronously, intermittently, temporally separated pulses, or a pulse-wise manner), wherein the sequence (a-1) includes supplying in the time-divisional manner a metal-containing gas and a first reducing gas to the substrate a predetermined number of times to form a first amorphous metal film on the substrate, and the sequence (a-2) includes simultaneously supplying the metal-containing gas and a second reducing gas to the substrate having the first amorphous metal film formed thereon to form a second amorphous metal film on the first amorphous metal film.

The invention claimed is:

1. A method of manufacturing a semiconductor device, comprising:
    (a) forming an amorphous metal film on a top surface, a back surface and a side surface of each of plurality of substrates arranged vertically in a horizontal posture while maintaining each of the plurality of substrates at a first temperature by alternately repeating steps (a-1) and (a-2), each of the plurality of substrates having a metal-containing film formed only on the top surface exclusive of the back surface and the side surface, and the amorphous metal film comprising a first amorphous metal film having compressive stress and a second amorphous metal film having tensile stress alternately stacked therein,
    wherein the step (a-1) comprises alternately supplying a metal-containing gas and a first reducing gas to each of the plurality of substrates a predetermined number of times to form the first amorphous metal film having compressive stress on each of the plurality of substrates, and
    the step (a-2) comprises simultaneously supplying the metal-containing gas and a second reducing gas to each of the plurality of substrates having the first amorphous metal film formed thereon to form the second amorphous metal film having tensile stress on the first amorphous metal film; and
    (b) heating each of the plurality of substrates having the amorphous metal film formed thereon to a second temperature higher than the first temperature after performing the step (a).

2. The method of claim 1, wherein at least a portion of the amorphous metal film is crystallized by heating each of the plurality of substrates having the amorphous metal film formed thereon in the step (b).

3. The method of claim 1, wherein the first temperature ranges from 100° C. to 250° C., and the second temperature ranges from 500° C. to 1200° C.

4. The method of claim 3, wherein the first temperature ranges from 150° C. to 200° C., and the second temperature ranges from 500° C. to 800° C.

5. The method of claim 4, wherein the first temperature is 200° C., and the second temperature is 600° C.

6. The method of claim 1, wherein the metal-containing gas comprises a tungsten-containing gas, each of the first amorphous metal film and the second amorphous metal film comprises an amorphous tungsten layer, and the amorphous metal film comprises an amorphous tungsten film.

7. The method of claim 6, wherein the tungsten-containing gas comprises a halogen compound including tungsten.

8. The method of claim 7, wherein the tungsten-containing gas comprises $WF_6$ gas.

9. The method of claim 8, wherein the first reducing gas comprises a boron-containing gas or a silicon-containing gas, and the second reducing gas comprises a hydrogen-containing gas free of other elements.

10. The method of claim 9, wherein the first reducing gas comprises $B_2H_6$ gas, and the second reducing gas comprises $H_2$ gas.

11. The method of claim 1, wherein each of the plurality of substrates comprises a silicon substrate, wherein the first amorphous metal film is formed as a first layer in contact with the metal-containing film and silicon constituting the silicon substrate, and the second amorphous metal film is formed as a top layer on the first amorphous metal film.

* * * * *